US012243572B2

(12) United States Patent
Yoshikawa

(10) Patent No.: US 12,243,572 B2
(45) Date of Patent: Mar. 4, 2025

(54) MAGNETIC MEMORY DEVICE

(71) Applicant: Kioxia Corporation, Tokyo (JP)

(72) Inventor: Masatoshi Yoshikawa, Tokyo (JP)

(73) Assignee: Kioxia Corporation, Tokyo (JP)

( * ) Notice: Subject to any disclaimer, the term of this patent is extended or adjusted under 35 U.S.C. 154(b) by 178 days.

(21) Appl. No.: 18/178,993

(22) Filed: Mar. 6, 2023

(65) Prior Publication Data

US 2024/0079039 A1   Mar. 7, 2024

(30) Foreign Application Priority Data

Aug. 31, 2022   (JP) ................. 2022-138459

(51) Int. Cl.
| G11C 11/16 | (2006.01) |
| H10B 61/00 | (2023.01) |
| H10N 50/10 | (2023.01) |
| H10N 50/85 | (2023.01) |

(52) U.S. Cl.
CPC ........ *G11C 11/161* (2013.01); *G11C 11/1675* (2013.01); *H10B 61/22* (2023.02); *H10N 50/10* (2023.02); *H10N 50/85* (2023.02)

(58) Field of Classification Search
None
See application file for complete search history.

(56) References Cited

U.S. PATENT DOCUMENTS

| 9,425,388 B2 | 8/2016 | Tomioka et al. |
| 9,589,619 B2 | 3/2017 | Lee et al. |
| 9,881,660 B2 | 1/2018 | Yoda et al. |
| 10,374,150 B2 | 8/2019 | Kato et al. |
| 10,840,434 B2 | 11/2020 | Kitagawa et al. |

(Continued)

FOREIGN PATENT DOCUMENTS

| JP | 2019004071 A | 1/2019 |
| JP | 2020043282 A | 3/2020 |

(Continued)

OTHER PUBLICATIONS

Fukami, et al., "A spin-orbit torque switching scheme with collinear magnetic easy axis and current configuration", Nature Nanotechnology, vol. 11, pp. 621-625, Jul. 2016.

(Continued)

*Primary Examiner* — Tan T. Nguyen
(74) *Attorney, Agent, or Firm* — Holtz, Holtz & Volek PC

(57) ABSTRACT

A magnetic memory device includes first to third conductors and a 3-terminal type memory cell coupled to the first to third conductors. The memory cell includes: a fourth conductor and a magnetoresistance effect element provided between the fourth and third conductors. The magnetoresistance effect element includes: a first ferromagnet in contact with the fourth conductor; a second ferromagnet provided in an opposite side of the fourth conductor with respect to the first ferromagnet; a dielectric between the first and second ferromagnets; a third ferromagnet provided in an opposite side of the first ferromagnet with respect to the second ferromagnet; and a nonmagnet provided between the second and third ferromagnets. A concentration of a noble metal contained in the first ferromagnet is higher than a concentration of the noble metal contained in the second ferromagnet.

20 Claims, 16 Drawing Sheets

(56) References Cited

U.S. PATENT DOCUMENTS

| 10,937,947 B2 | 3/2021 | Yoshikawa et al. |
| 11,322,189 B2 | 5/2022 | Yoshikawa |
| 2020/0083431 A1 | 3/2020 | Iwasaki et al. |
| 2020/0286536 A1 | 9/2020 | Fukami et al. |
| 2020/0303632 A1 | 9/2020 | Watanabe et al. |
| 2021/0098689 A1 | 4/2021 | Watanabe et al. |
| 2022/0085279 A1 | 3/2022 | Sawada et al. |
| 2023/0076145 A1* | 3/2023 | Gallagher ............ H10N 52/01 |

FOREIGN PATENT DOCUMENTS

| TW | 202011395 A | 3/2020 |
| TW | 202036948 A | 10/2020 |
| TW | 202213341 A | 4/2022 |

OTHER PUBLICATIONS

Liao, et al., "Spin-Orbit-Torque Material Exploration for Maximum Array-Level Read/Write Performance", 2020 IEEE International Electron Devices Meeting (IEDM), 2020.

Nozaki, et al., "Highly efficient voltage control of spin and enhanced interfacial perpendicular magnetic anisotropy in iridium-doped Fe/MgO magnetic tunnel junctions", NPG Asia Materials, vol. 9, 2017.

\* cited by examiner

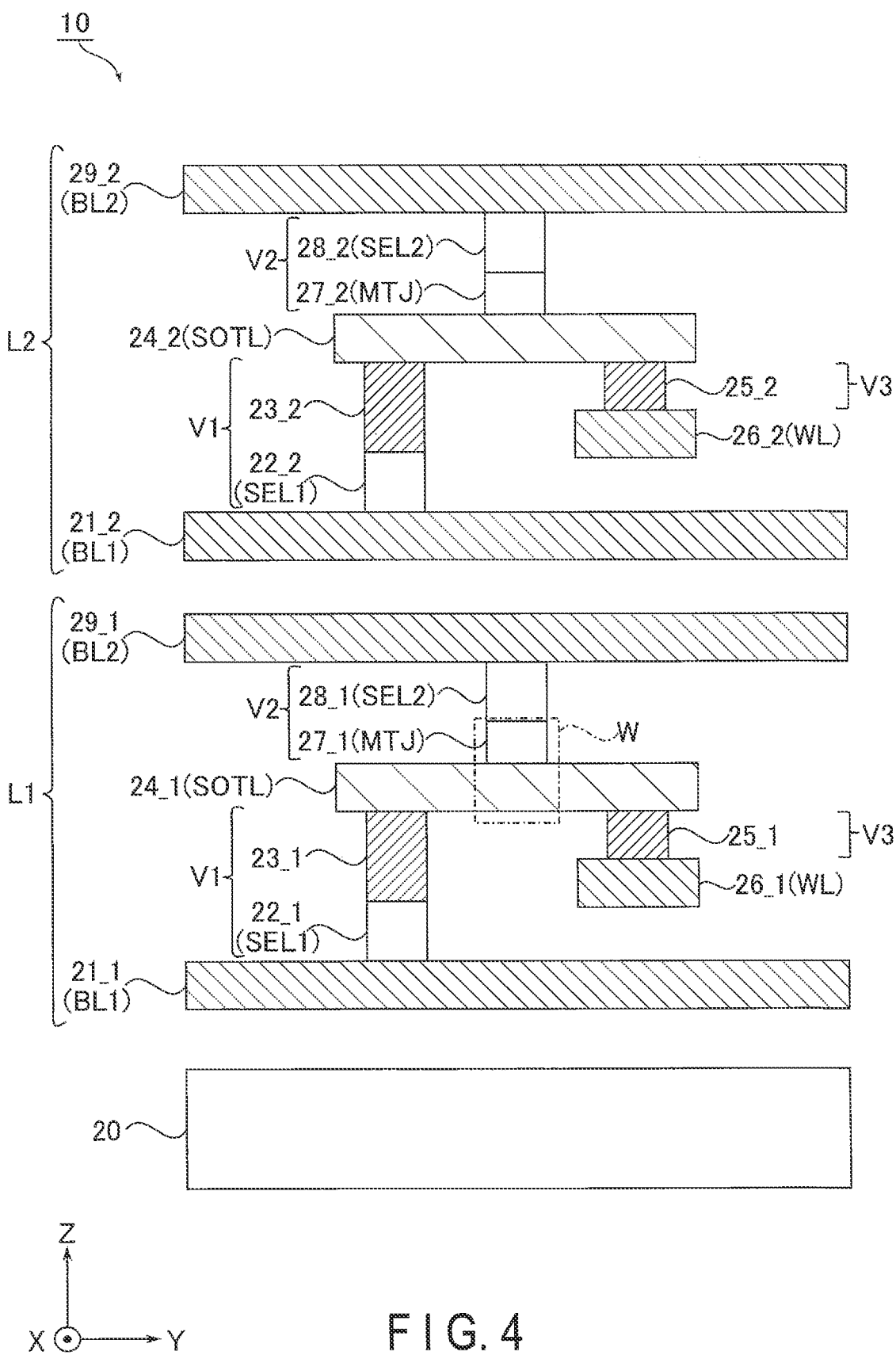
F I G. 4

If there is no potential difference

If there is a potential difference

If there is no potential difference

If there is a potential difference

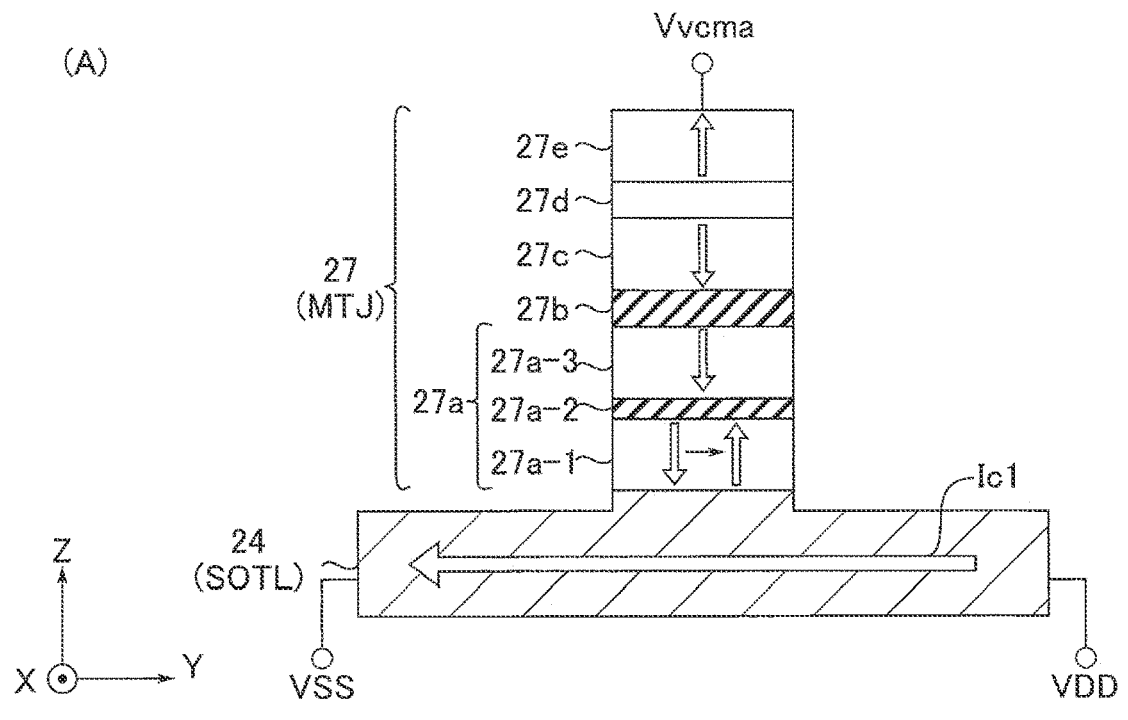
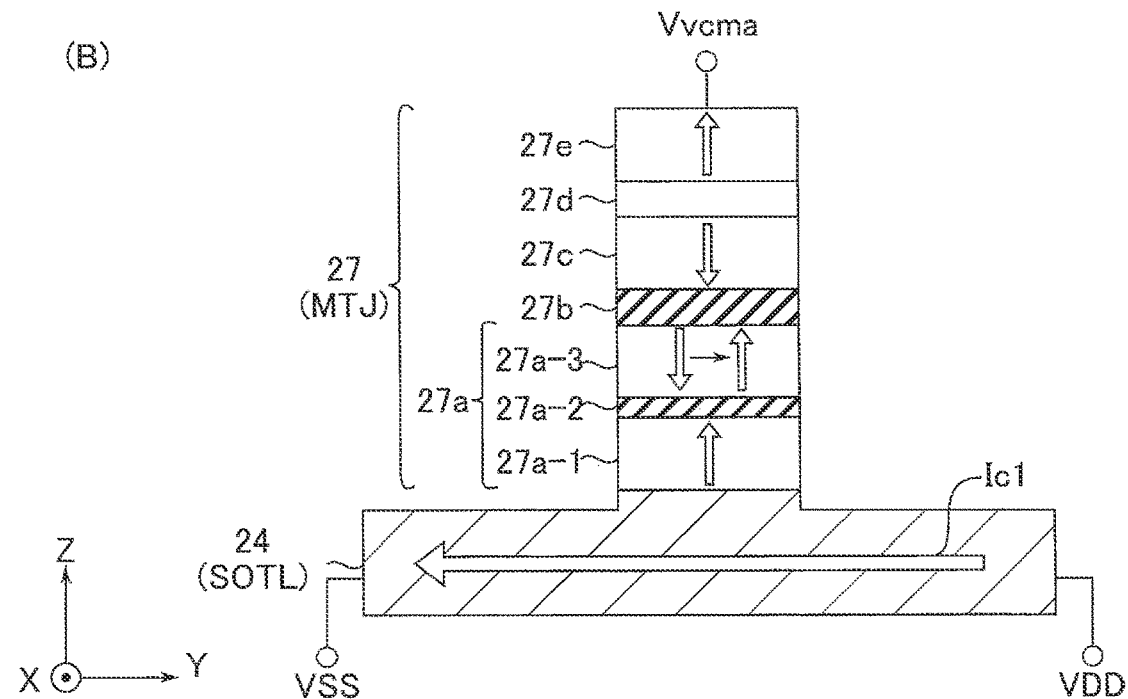
F I G. 13

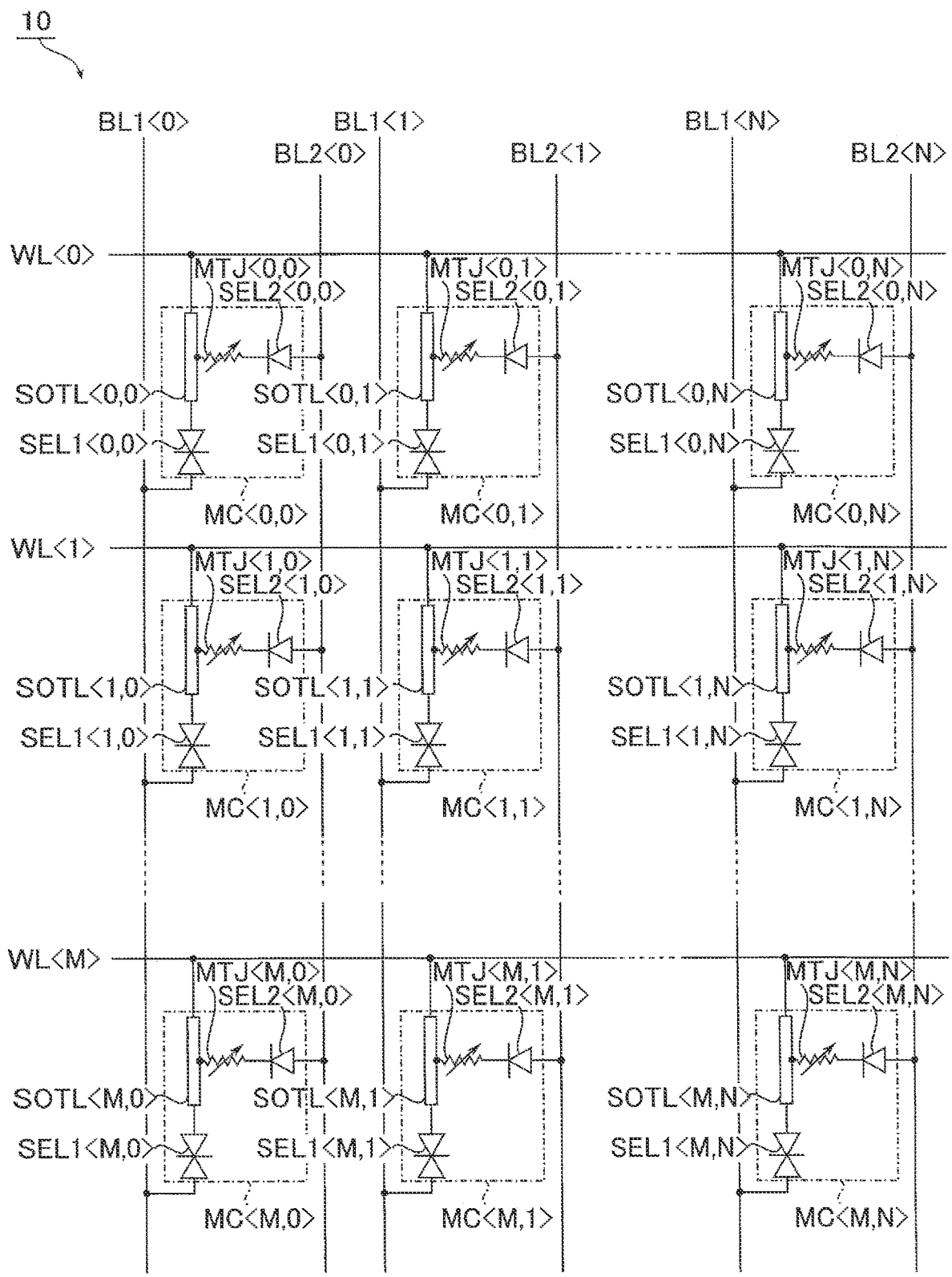
F I G. 17

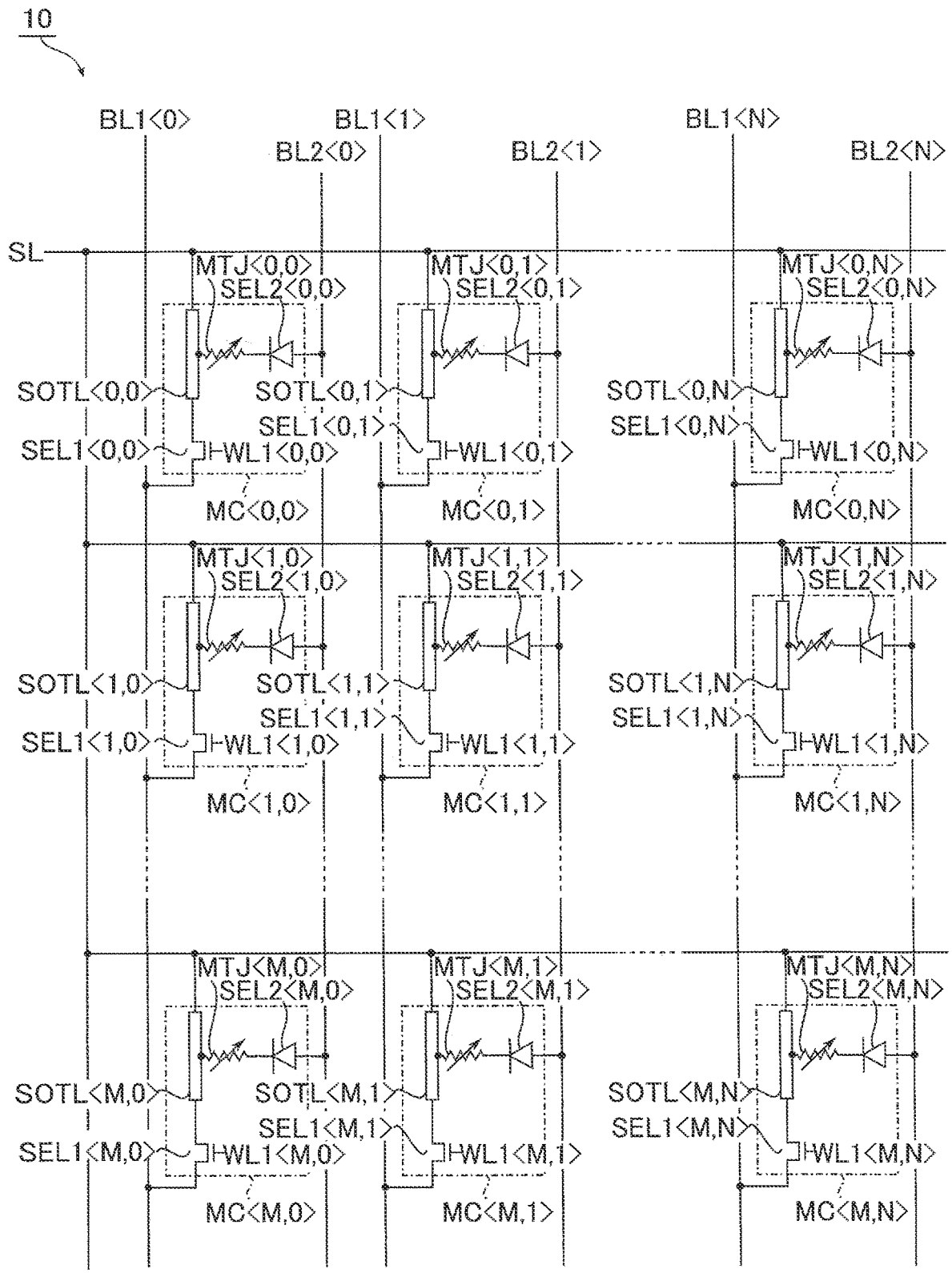
F I G. 18

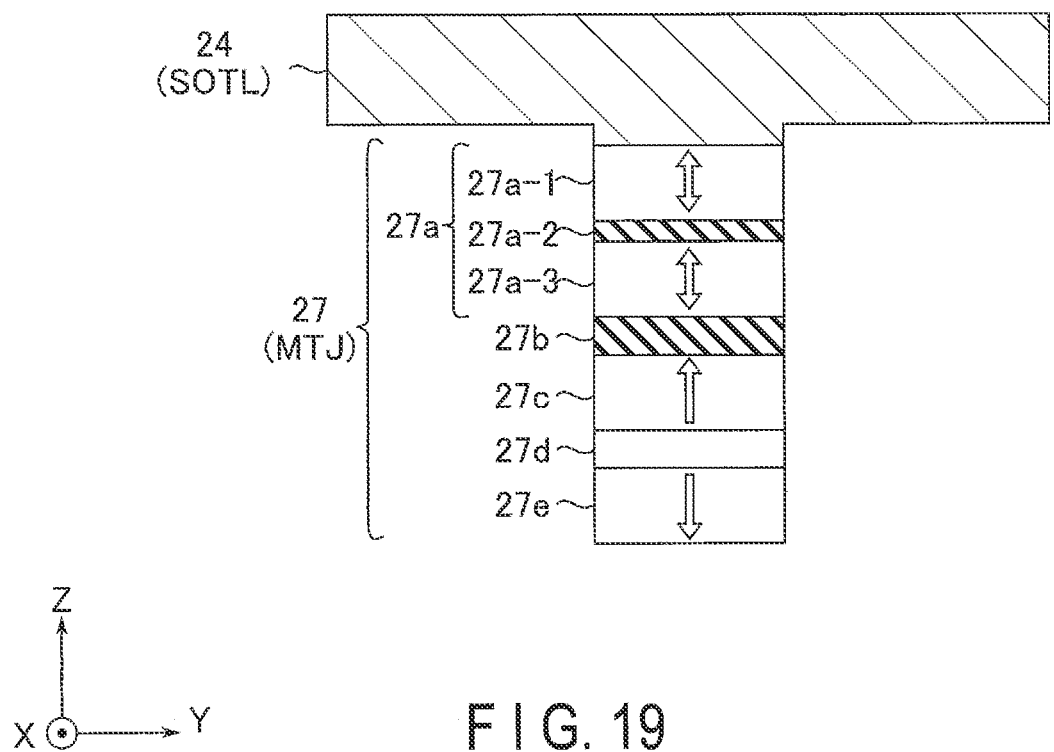
F I G. 19
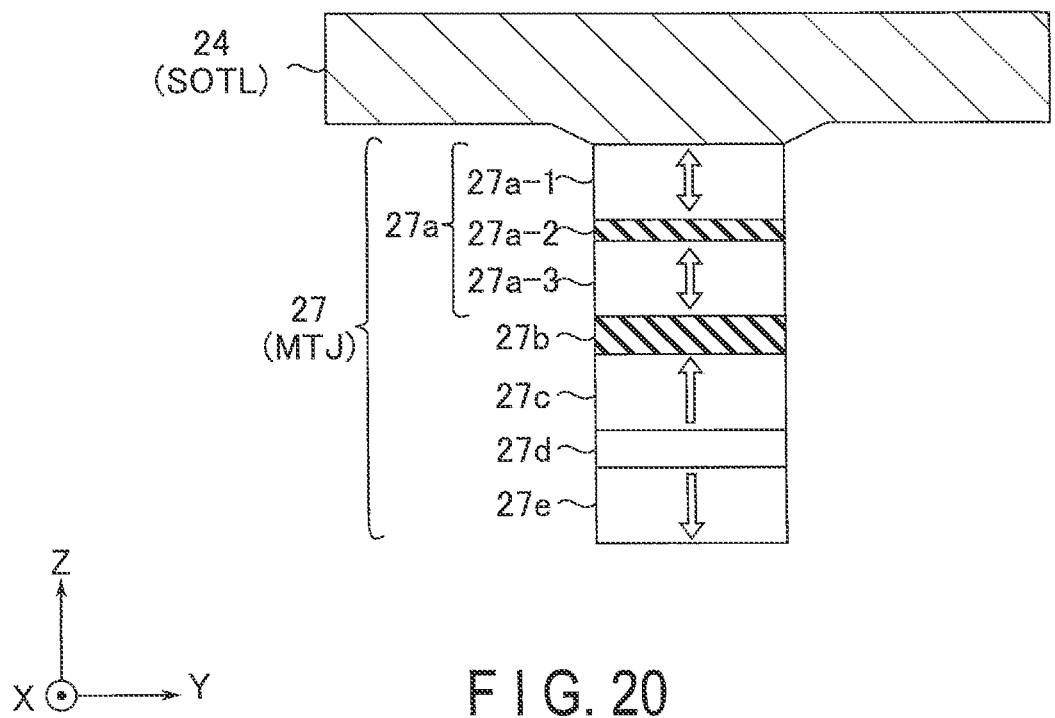
F I G. 20

MAGNETIC MEMORY DEVICE

CROSS-REFERENCE TO RELATED APPLICATION

This application is based upon and claims the benefit of priority from Japanese Patent Application No. 2022-138459, filed Aug. 31, 2022, the entire contents of which are incorporated herein by reference.

FIELD

Embodiments described herein relate generally to a magnetic memory device.

BACKGROUND

A memory device using a magnetoresistance effect element as a storage element is known. Various methods have been proposed as a method of writing data in a magnetoresistance effect element.

BRIEF DESCRIPTION OF THE DRAWINGS

FIG. 4 is a cross-sectional view taken along line IV-IV of FIG. 3, showing an example of a cross-sectional structure of a memory cell array according to the embodiment.

FIG. 13 is a cross-sectional diagram showing an example of a write operation in the magnetic memory device according to the embodiment.

FIG. 17 is a circuit diagram showing a circuit configuration example of a memory cell array according to a third modification.

FIG. 18 is a circuit diagram showing a circuit configuration example of a memory cell array according to a fourth modification.

FIG. 19 is a cross-sectional view of a first example of the cross-sectional structure of a magnetoresistance effect element and an interconnect in the vicinity thereof according to a fifth modification.

FIG. 20 is a cross-sectional view of a second example of the cross-sectional structure of a magnetoresistance effect element and an interconnect in the vicinity thereof according to the fifth modification.

DETAILED DESCRIPTION

In general, according to one embodiment, a magnetic memory device includes: a first conductive layer; a second conductive layer; a third conductive layer extending in a first direction; and a 3-terminal type memory cell coupled to the first conductive layer, the second conductive layer, and the third conductive layer. The memory cell includes: a fourth conductive layer extending in the first direction; and a magnetoresistance effect element provided between the fourth conductive layer and the third conductive layer. The magnetoresistance effect element includes: a first ferromagnetic layer in contact with the fourth conductive layer in a second direction intersecting with the first direction; a second ferromagnetic layer provided in an opposite side of the fourth conductive layer with respect to the first ferromagnetic layer; a dielectric layer between the first ferromagnetic layer and the second ferromagnetic layer; a third ferromagnetic layer provided in an opposite side of the first ferromagnetic layer with respect to the second ferromagnetic layer; and a nonmagnetic layer provided between the second ferromagnetic layer and the third ferromagnetic layer and containing oxygen (O) and magnesium (Mg). A concentration of a noble metal contained in the first ferromagnetic layer is higher than a concentration of the noble metal contained in the second ferromagnetic layer.

Hereinafter, embodiments will be described with reference to the drawings. In the descriptions below, components having the same functions and configurations will be denoted by the same reference symbols. To distinguish a plurality of structural elements having a common reference symbol from each other, an additional symbol is added after the common reference symbol. If there is no need to mutually distinguish a plurality of structural elements, the plurality of structural elements are assigned only a common reference symbol without an additional symbol. Additional symbols are not limited to subscripts or superscripts, and they may be lowercase alphabetical characters added to references symbols, symbols, and indices that indicate an array.

In the present description, a magnetic memory device is a magnetoresistance random-access memory (MRAM), for example. A magnetic memory device includes a magnetoresistance effect element as a storage element. The magnetoresistance effect element is a type of resistance change element having a magnetoresistance effect brought by a magnetic tunnel junction (MTJ). The magnetoresistance effect element may be called an MTJ element.

1. Embodiment

The embodiment is described hereinafter.

1.1 Configuration

First, a configuration of a magnetic memory device according to the embodiment is described.

1.1.1 Memory Device

Figure 1:
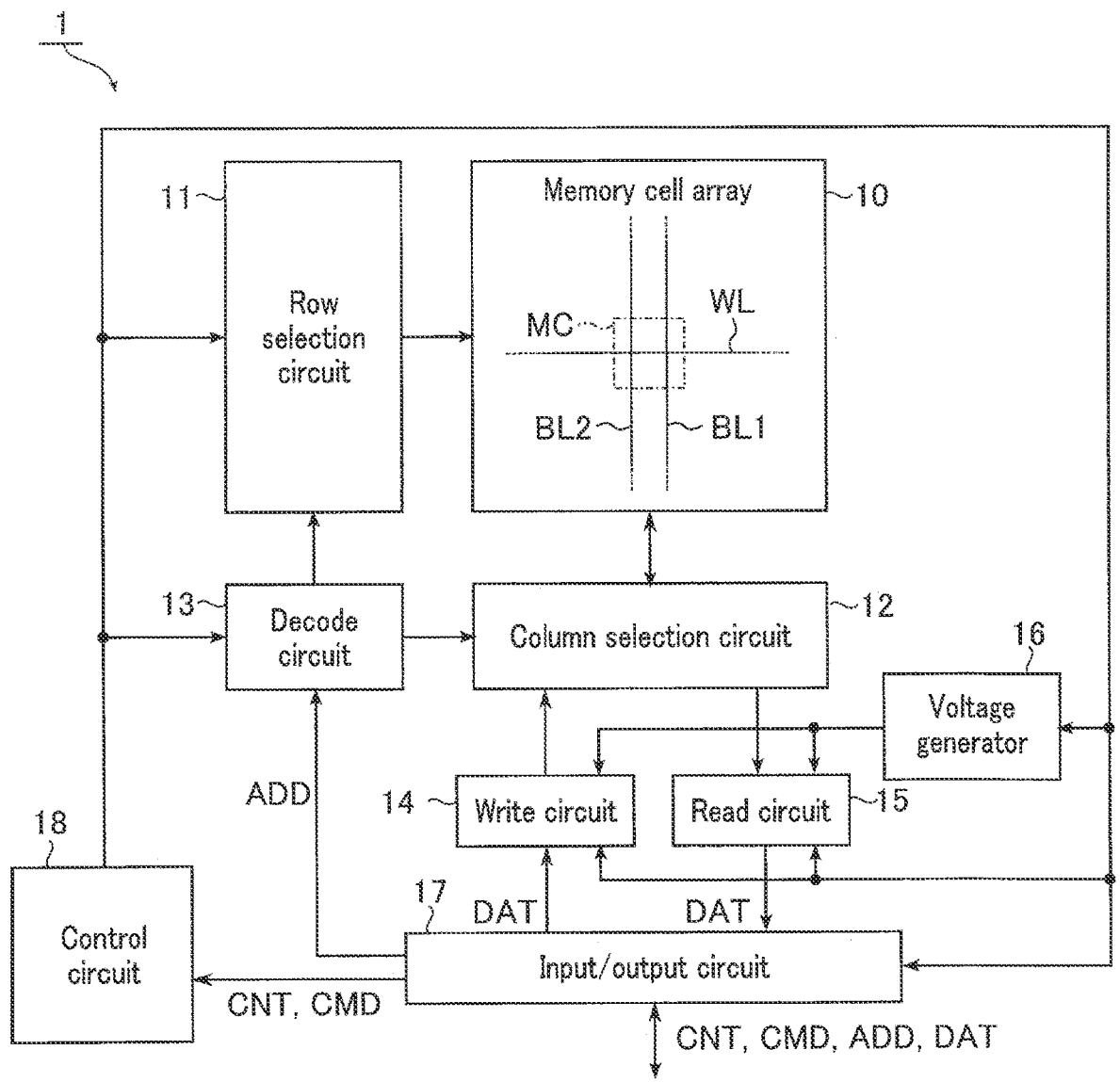
FIG. 1 is a block diagram showing a configuration example of a magnetic memory device according to an embodiment.

FIG. 1 is a block diagram showing a configuration example of a magnetic memory device according to the embodiment. The magnetic memory device 1 includes a memory cell array 10, a row selection circuit 11, a column selection circuit 12, a decode circuit 13, a write circuit 14, a read circuit 15, a voltage generator 16, an input/output circuit 17, and a control circuit 18.

The memory cell array 10 is a data storage unit in the magnetic memory device 1. The memory cell array 10 includes a plurality of memory cells MC. Each of the memory cells MC is associated with a set of a row and a column. The memory cells MC of the same row are coupled to the same word line WL, and the memory cells MC of the same column are coupled to the same set of a first bit line BL1 and a second bit line BL2.

The row selection circuit 11 is a circuit for selecting a row of the memory cell array 10. The row selection circuit 11 is coupled to the memory cell array 10 via word lines WL. The row selection circuit 11 is supplied with a result of decoding an address ADD from the decode circuit 13 (row address). The row selection circuit 11 selects word line WL corresponding to a row based on the decoding result of address ADD. Hereinafter, a selected word line WL will be called a "selected word line WL". Word lines WL other than the selected word line WL will be called "non-selected word lines WL".

The column selection circuit 12 is a circuit for selecting a column of the memory cell array 10. The column selection circuit 12 is coupled to the memory cell array 10 via a first bit line BL1 and a second bit line BL2. The column selection circuit 12 is supplied with a result of decoding an address ADD received from the decode circuit 13 (column address). The column selection circuit 12 selects a first bit line BL1 and a second bit line BL2 corresponding to a row based on the result of decoding an address ADD. Hereinafter, selected first bit line BL1 and second bit line BL2 will be called "selected bit line BL1" and "selected bit line BL2", respectively. First bit lines BL1 other than the selected bit line BL1 and second bit lines BL2 other than the selected bit line BL2 will be called "non-selected bit lines BL1" and "non-selected bit lines BL2", respectively.

The decode circuit 13 is a decoder that decodes an address ADD received from the input/output circuit 17. The decode circuit 13 supplies the result of decoding the address ADD to the row selection circuit 11 and the column selection circuit 12. The address ADD includes a column address and a row address.

The write circuit 14 includes a write driver (not shown), for example. The write circuit 14 writes data to each memory cell MC.

The read circuit 15 includes a sense amplifier (not shown) for example. The read circuit 15 reads data from each memory cell MC.

The voltage generator 16 generates voltages for various types of operations in the memory cell array 10, using a power supply voltage supplied from a device (not shown) externally to the magnetic memory device 1. For example, the voltage generator 16 generates various voltages required for a write operation, and outputs them to the write circuit 14. For example, the voltage generator 16 generates various voltages required for a read operation, and outputs them to the read circuit 15.

The input/output circuit 17 governs communications outside of the magnetic memory device 1. The input/output circuit 17 forwards an address ADD received from the outside of the magnetic memory device 1 to the decode circuit 13. The input/output circuit 17 forwards a command CMD received from the outside of the magnetic memory device 1 to the control circuit 18. The input/output circuit 17 sends and receives various control signals CNT between the outside of the magnetic memory device 1 and the control circuit 18. The input/output circuit 17 transfers data DAT received from the outside of the magnetic memory device 1 to the write circuit 14, and outputs data DAT transferred from the read circuit 15 to the outside of the magnetic memory device 1.

The control circuit 18 includes, for example, a processor, such as a central processing unit (CPU), a read-only memory (ROM), and a random-access memory (RAM). The control circuit 18 controls, based on a control signal CNT and a command CMD, the circuits included in the magnetic memory device 1, namely the row selection circuit 11, the column selection circuit 12, the decode circuit 13, the write circuit 14, the read circuit 15, the voltage generator 16, and the input/output circuit 17.

1.1.2 Memory Cell Array

Next, an example of a configuration of a memory cell array of the magnetic memory device according to the embodiment is described.

(Circuit Configuration)

Figure 2:
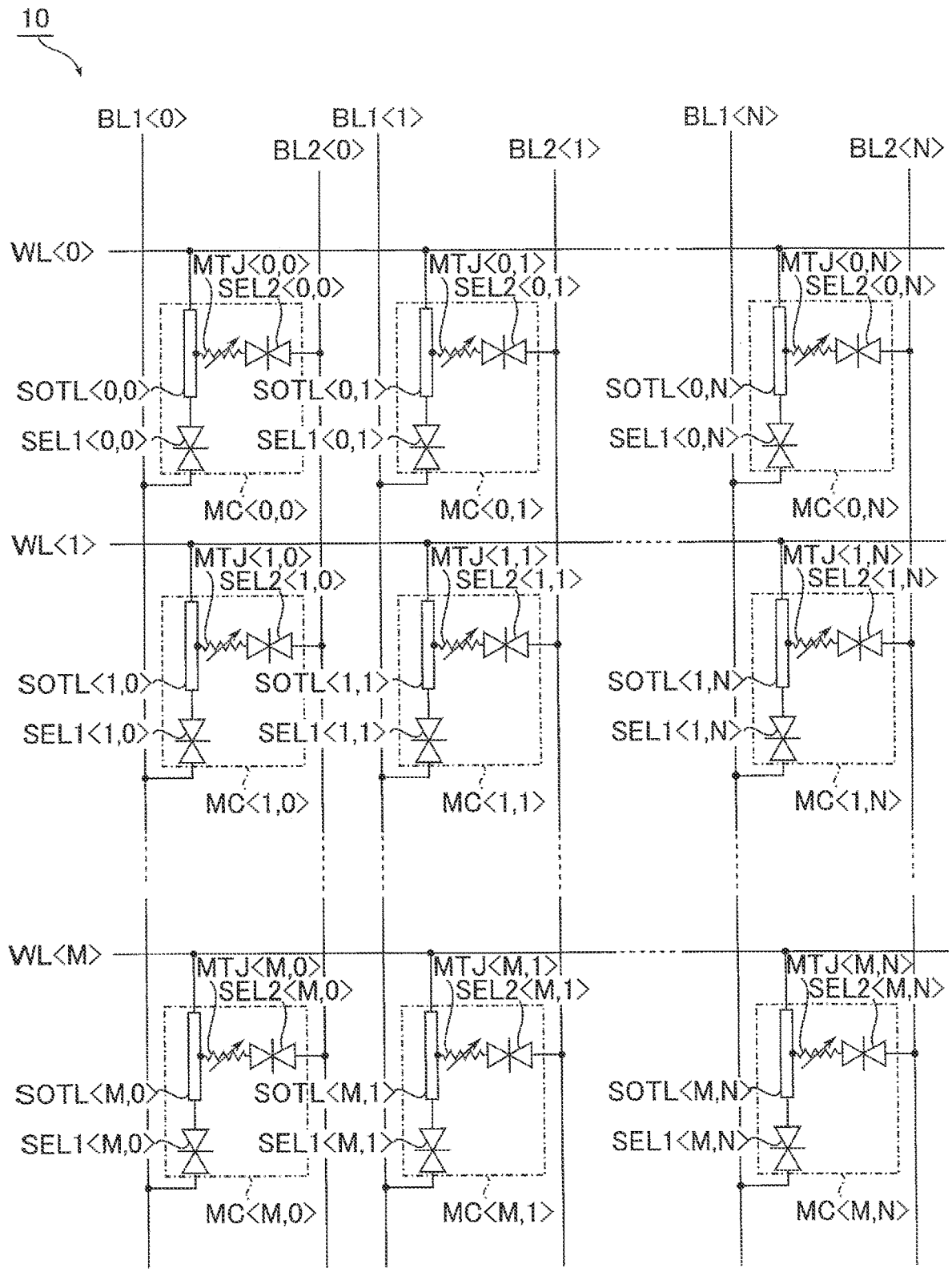
FIG. 2 is a circuit diagram showing a circuit configuration example of a memory cell array according to the embodiment.

FIG. 2 is a diagram showing an example of the circuit configuration of a memory cell array according to the embodiment. In FIG. 2, each of the word lines WL, the first bit lines BL1, and the second bit lines BL2 is shown, being distinguished by appended symbols including an index ("< >").

The memory cell array 10 includes a plurality of memory cells MC, a plurality of word lines WL, a plurality of first bit lines BL1, and a plurality of second bit lines BL2. In the example shown in FIG. 2, a plurality of memory cells MC include (M+1)×(N+1) memory cells, MC<0, 0>, MC<0, 1>, ..., MC<0, N>, MC<1, 0>, ..., and MC<M, N> (each of M and N is an integer equal to or greater than 2). M and N are integers equal to or greater than 2 in the example of FIG. 2; however, the embodiment is not limited to this example. M and N may be either 0 or 1. The plurality of word lines WL include (M+1) word lines, WL<0>, WL<1>, ..., and WL<M>. The plurality of first bit lines BL1 include (N+1) first bit lines, BL1<0>, WBL<1>, ..., WBL<N>. The plurality of second bit lines BL2 include (N+1) second bit lines, BL2<0>, RBL<1>, ..., RBL<N>.

A plurality of memory cells MC are arranged in a matrix pattern within a memory cell array 10. A memory cell MC is associated with a set of one of the plurality of word lines WL and one set of a first bit line BL1 and a second bit line BL2 of the plurality of first bit lines BL1 and the plurality of second bit lines BL2. In other words, memory cell MC<i, j> (0≤i≤M, 0≤j≤N) is coupled to word line WL<i>, first bit line BL1<j>, and second bit line BL2<j>.

Memory cell MC<i, j> is a 3-terminal type memory cell having a first end coupled to word line WL<i>, a second end coupled to first bit line BL1<j>, and a third end coupled to second bit line BL2<j>. Memory cell MC<i, j> includes switching elements SEL1<i, j> and SEL2<i, j>, magnetoresistance effect element MTJ<i, j>, and interconnect SOTL<i, j>.

Interconnect SOTL<i, j> includes a first portion, a second portion, and a third portion disposed between the first portion and the second portion. A first portion of interconnect SOTL<i, j> is coupled to word line WL<i>. A second portion of interconnect SOTL<i, j> is coupled to first bit line BL1<j>. A third portion of interconnect SOTL<i, j> is coupled to second bit line BL2<j>. Switching element SEL1<i, j> is coupled between the second portion of interconnect SOTL<i, j> and first bit line BL1<j>. Magnetoresistance effect element MTJ<i, j> is coupled between the third portion of interconnect SOTL<i, j> and second bit line BL2<j>. Switching element SEL2<i, j> is coupled between magnetoresistance effect element MTJ<i, j> and second bit line BL2<j>.

The switching elements SEL1 and SEL2 are a 2-terminal type switching element. A 2-terminal type switching element differs from a 3-terminal type switching element, such as a transistor, etc., in its having no third terminal. When a voltage applied between two terminals is smaller than threshold voltages Vth1 and Vth2, the switching elements SEL1 and SEL2 are in a "high-resistance" state or "off" state, e.g., in an electrically non-conductive state. When a voltage applied between two terminals is equal to or greater than threshold voltages Vth1 and Vth2, the switching elements SEL1 and SEL2 transition to a "low-resistance" state or "on" state, e.g., to an electrically conductive state. More specifically, for example if a voltage applied to a corresponding memory cell MC is lower than threshold voltages Vth1 and Vth2, the switching elements SEL1 and SEL2 interrupt a current (turn to an off state), serving as an insulator having a large resistance value. If a voltage applied to a corresponding memory cell MC is equal to or greater than threshold voltages Vth1 and Vth2, the switching elements SEL1 and SEL2 pass a current (turn to an on state), serving as an insulator having a small resistance value. The switching elements SEL1 and SEL2 switch between passing and interrupting a current in accordance with a magnitude of a voltage applied to a corresponding memory cell MC, regardless of a polarity of the voltage applied to the two terminals (in other words, regardless of the direction of the current passing between the two terminals).

An interconnect SOTL is a current path in the memory cell MC. For example, if the switching element SEL1 is in an on state and the switching element SEL2 is in an off state, the interconnect SOTL functions as a current path between the word line WL and the first bit line BL1. For example, if the switching element SEL1 is in an off state and the switching element SEL2 is in an on state, a part of the interconnect SOTL functions as a current path between the word line WL and the second bit line BL2.

The magnetoresistance effect element MTJ is a resistance change element. With a current whose path is controlled by the switching elements SEL1 and SEL2, a resistance value of a corresponding magnetoresistance effect element MTJ can be switched between a low-resistance state and a high-resistance state. The magnetoresistance effect element MTJ functions as a storage element that stores data in a nonvolatile manner through the change in its resistance state.

(Planar Layout)

Next, the planar layout of the memory cell array according to the embodiment is described. In the following description, a plane parallel to a substrate surface will be referred to as an "XY plane". The direction in which the magnetic memory device 1 is provided with respect to the substrate surface is defined as a Z direction or an upward direction. The directions intersecting each other on the XY plane are an X direction and a Y direction.

Figure 3:
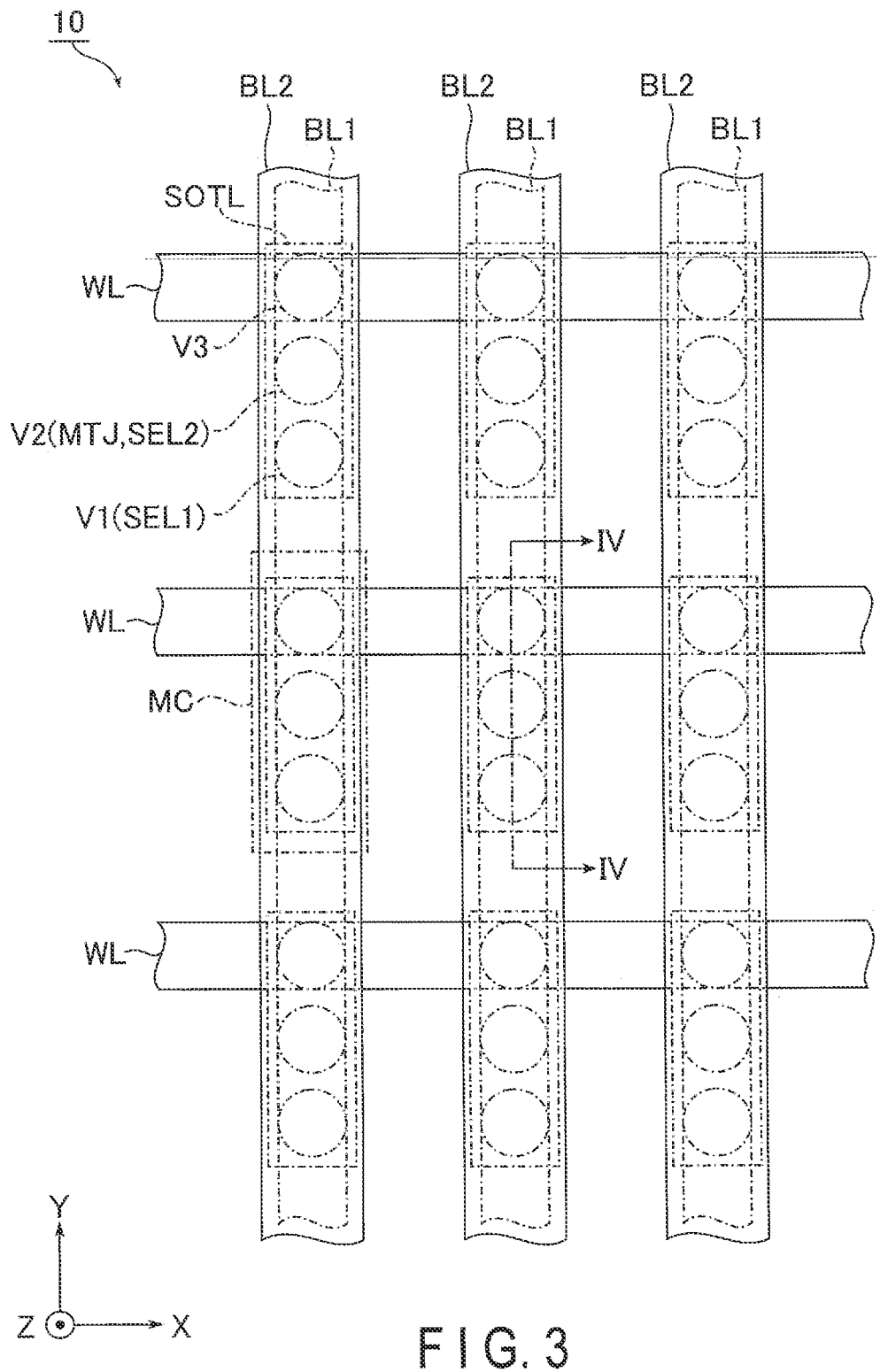
FIG. 3 is a plan view showing an example of a planar layout of a memory cell array according to the embodiment.

FIG. 3 is a plan view showing an example of a planar layout of memory cell array according to the embodiment. In FIG. 3, the structures such as the insulating layers, etc. are omitted.

A memory cell array 10 further includes a plurality of vertical structures V1, a plurality of vertical structures V2, and a plurality of vertical structures V3. Each of the vertical structures V1 includes a switching element SEL1. Each of the vertical structures V2 includes a magnetoresistance effect element MTJ and a switching element SEL2.

A plurality of first bit lines BL1 are aligned in the X direction. Each of the first bit lines BL1 extends in the Y direction.

A plurality of word lines WL are provided above the plurality of first bit lines BL1. The plurality of word lines WL are arranged in the Y direction. Each of the word lines WL extends in the X direction.

A plurality of interconnects SOTL are arranged above the word lines WL. In a plan view, each of the interconnects SOTL has a rectangular shape having longer sides in the Y direction compared to those in the X direction. Each of the interconnects SOTL extends in the Y direction. In a plan view, each of the interconnects SOTL is arranged in a matrix in correspondence to a location overlapping a single word line WL and a single first bit line BL1.

A plurality of second bit lines BL2 are provided above the plurality of interconnects SOTL. The plurality of second bit lines BL2 are aligned in the X direction. Each of the second bit lines BL2 extends in the Y direction. In a plan view, each of the second bit lines BL2 is arranged in correspondence to a location overlapping the plurality of first bit lines BL1.

The plurality of vertical structures V1 extend in the Z direction. In a plan view, each of the plurality of vertical structures V1 has a circular shape. Each of the plurality of vertical structures V1 couples a corresponding first bit line BL1 to one interconnect SOTL. In other words, each of the vertical structures V1 is coupled to the second portion of a corresponding interconnect SOTL.

The plurality of vertical structures V2 extend in the Z direction. In a plan view, each of the plurality of vertical structures V2 has a circular shape. Each of the plurality of vertical structures V2 couples a corresponding second bit line BL2 to one interconnect SOTL. In other words, each of the vertical structures V2 is coupled to the third portion of a corresponding interconnect SOTL.

The plurality of vertical structures V3 extend in the Z direction. In a plan view, each of the plurality of vertical structures V3 has a circular shape. Each of the plurality of vertical structures V3 couples a corresponding word line WL to one interconnect SOTL. In other words, each of the vertical structures V3 is coupled to the first portion of a corresponding interconnect SOTL.

In the above-described structures, a set of one interconnect SOTL and one vertical structure V1, one vertical structure V2, and one vertical structure V3, each of which is coupled to the one interconnect SOTL functions as a memory cell MC.

(Cross-Sectional Structure)

Next, the cross-sectional structure of the memory cell array according to the embodiment is described.

FIG. 4 is a cross-sectional view taken along line IV-IV of FIG. 3, showing an example of a cross-sectional structure of a memory cell array according to the embodiment. The memory cell array 10 further includes a semiconductor substrate 20 and layered structures L1 and L2. The layered structure L1 includes conductive layers 21_1, 23_1, 24_1, 25_1, 26_1, and 29_1 and element layers 22_1, 27_1, and 28_1. The layered structure L2 includes conductive layers 21_2, 23_2, 24_2, 25_2, 26_2, and 29_2 and element layers 22_2, 27_2, and 28_2. A structure followed by "_x" indicates that the structure belongs to a layered structure Lx (x is an integer equal to or greater than 1).

The layered structures L1 and L2 are stacked in the Z direction in this order above the semiconductor substrate 20. Each of the layered structures L1 and L2 correspond to the planar layout shown in FIG. 3.

A peripheral circuit, such as the row selection circuit 11 and the column selection circuit 12, etc., may be provided between the semiconductor substrate 20 and the layered structure L1. A circuit is not necessarily formed between the semiconductor substrate 20 and the layered structure L1. If a circuit is not formed in the semiconductor substrate 20 and the layered structure L1, a shallow trench isolation (STI) may be formed in the part located below the layered structure L1.

The layered structure L1 is now described.

Conductive layer 21_1 is provided above the semiconductor substrate 20. Conductive layer 21_1 is used as a first bit line BL1. Conductive layer 21_1 extends in the Y direction.

On the upper surface of conductive layer 21_1, element layer 22_1 is provided. Element layer 22_1 is used as a switching element SEL1.

On the upper surface of element layer 22_1, conductive layer 23_1 is provided. Conductive layer 23_1 is used as a contact. Element layer 22_1 and conductive layer 23_1 constitute a vertical structure V1.

On the upper surface of conductive layer 23_1, conductive layer 24_1 is provided. Conductive layer 24_1 is used as interconnect SOTL. In conductive layer 24_1, the part in contact with conductive layer 23_1 corresponds to a second portion of the interconnect SOTL. Conductive layer 24_1 extends in the Y direction.

In conductive layer 24_1, conductive layer 25_1 is provided on the lower surface of the part differing from the part where the conductive layer 23_1 is provided. In conductive layer 24_1, the part in contact with conductive layer 25_1 corresponds to the first portion of the interconnect SOTL. Conductive layer 25_1 is used as a contact. Conductive layer 25_1 constitutes the vertical structure V3.

On the lower surface of conductive layer 25_1, conductive layer 26_1 is provided. Conductive layer 26_1 is used as a word line WL. Conductive layer 26_1 extends in the X direction.

In conductive layer 24_1, element layer 27_1 is provided on the upper surface of the part between the part where conductive layer 23_1 is provided and the part where conductive layer 25_1 is provided. In conductive layer 24_1, the part in contact with element layer 27_1 corresponds to the third portion of the interconnect SOTL. Element layer 27_1 is used as a magnetoresistance effect element MTJ.

On the upper surface of element layer 27_1, element layer 28_1 is provided. Element layer 28_1 is used as a switching element SEL2. Element layers 27_1 and 28_1 constitute a vertical structure V2.

On the upper surface of element layer 28_1, conductive layer 29_1 is provided. Conductive layer 29_1 is used as a second bit line BL2. Conductive layer 29_1 extends in the Y direction.

With the above-structures, a set of conductive layer 24_1 and the vertical structures V1, V2, and V3 in the layered structure L1 functions as a memory cell MC having three terminals respectively coupled to conductive layers 21_1, 29_1, and 26_1.

The layered structure L2 has a structure similar to that of the layered structure L1. In other words, conductive layers 21_2, 23_2, 24_2, 25_2, 26_2, and 29_2, and element layers 22_2, 27_2, and 28_2 have structures and functions similar to those of conductive layers 21_1, 23_1, 24_1, 25_1, 26_1, and 29_1, and element layers 22_1, 27_1, and 28_1. Thus, a set of conductive layer 24_2 and the vertical structures V1, V2, and V3 in the layered structure L2 functions as one memory cell MC having three terminals respectively coupled to conductive layers 21_2, 29_2, 26_2.

1.1.3 Magnetoresistance Effect Element and Interconnects in the Vicinity

Next, a structure of a magnetoresistance effect element and interconnects in the vicinity thereof in the magnetic memory device according to the embodiment is described.

Figure 5:
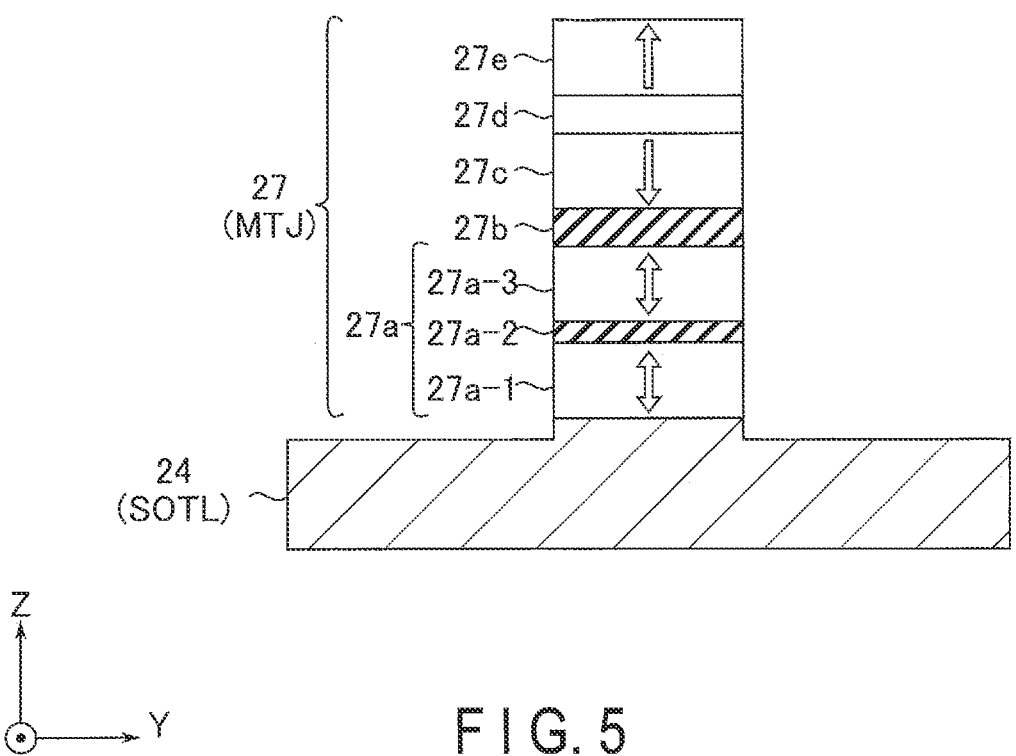
FIG. 5 is a cross-sectional view of a region W in FIG. 4, showing a first example of the cross-sectional structure of a magnetoresistance effect element and an interconnect in the vicinity thereof according to the embodiment.
Figure 6:
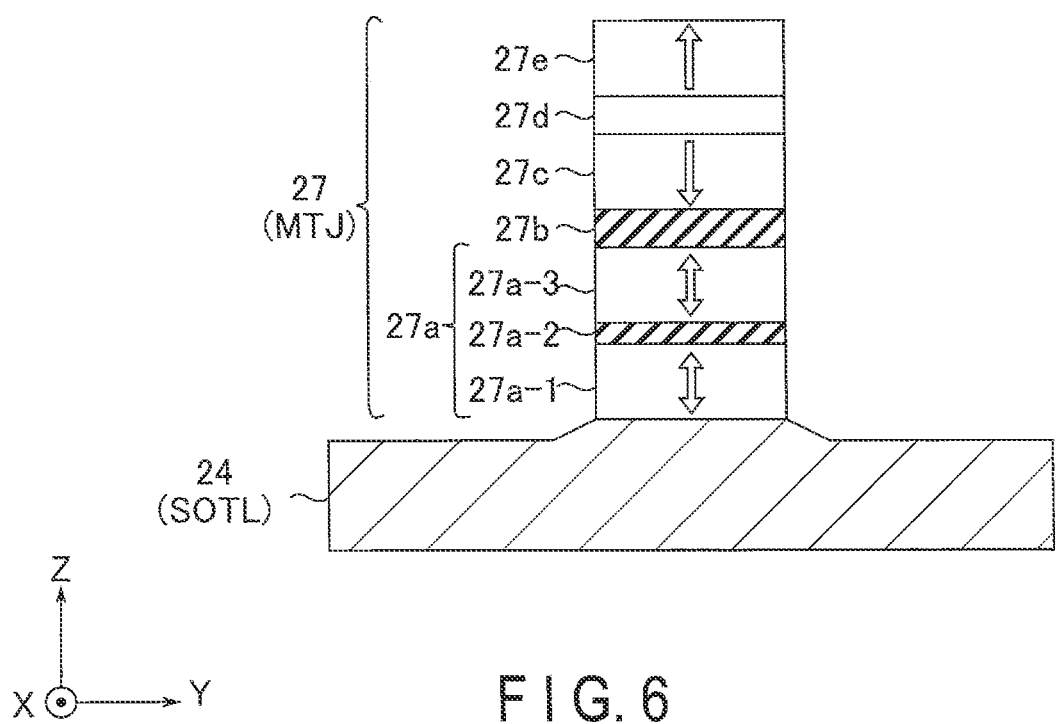
FIG. 6 is a cross-sectional view of the region W in FIG. 4, showing a second example of the cross-sectional structure of a magnetoresistance effect element and an interconnect in the vicinity thereof according to the embodiment.

FIG. 5 is a cross-sectional view of a region W in FIG. 4, showing a first example of the cross-sectional structure of a magnetoresistance effect element and an interconnect in the vicinity thereof according to the embodiment. FIG. 6 is a cross-sectional view of the region W in FIG. 4, showing a second example of the cross-sectional structure of a magnetoresistance effect element and an interconnect in the vicinity thereof according to the embodiment. As shown in FIGS. 5 and 6, the element layer 27 includes a layer stack 27a, a nonmagnetic layer 27b, a ferromagnetic layer 27c, a nonmagnetic layer 27d, and a ferromagnetic layer 27e. The layer stack 27a includes a ferromagnetic layer 27a-1, a dielectric layer 27a-2, and a ferromagnetic layer 27a-3. In this case, in the upper surface of the conductive layer 24, the part coupled to the ferromagnetic layer 27a-1 protrudes upper than the other part of the upper surface of the conductive layer 24. In the example shown in FIG. 5, the side surface of the coupling at which the conductive layer 24 is coupled to the ferromagnetic layer 27a-1 is aligned with the side surface of the ferromagnetic layer 27a-1. In the example shown in FIG. 6, the coupling at which the conductive layer 24 is coupled to the ferromagnetic layer 27a-1 is in a tapered shape.

First, the structure of the conductive layer 24 is described.

The conductive layer 24 is a conductive film containing a heavy metal having non-magnetic properties. The conductive layer 24 contains, as a heavy metal, at least one element selected from the group consisting of, for example, tantalum (Ta), tungsten (W), ruthenium (Ru), rhodium (Rh), palladium (Pd), silver (Ag), copper (Cu), osmium (Os), iridium (Ir), platinum (Pt), gold (Au), manganese (Mn), lead (Pb), and bismuth (Bi). The element contained in the conductive layer 24 as a heavy metal may contain an oxide. If tantalum (Ta) or tungsten (W) is contained, a preferable structure of the element is a B structure. In the conductive layer 24, an internally flowing current causes a spin orbit torque (SOT) mainly due to the bulk spin Hall effect. In some cases, a spin effect due to the spin splitter effect is caused. A spin orbit torque acts on the ferromagnetic layer 27a-1.

Next, the configuration of the element layer 27 is described.

In the central part of the upper surface of the conductive layer 24, a ferromagnetic layer 27a-1 is provided. The ferromagnetic layer 27a-1 is an electric conductive film having ferromagnetic properties. The ferromagnetic layer 27a-1 has a film thickness equal to or greater than 0.5 nm and equal to or less than 3.0 nm, for example. The ferromagnetic layer 27a-1 has an axis of easy magnetization in a direction perpendicular to the film plane (Z direction). A spin orbit torque occurring in the conductive layer 24 acts on the ferromagnetic layer 27a-1. If a spin orbit torque of a predetermined magnitude acts on the ferromagnetic layer 27a-1, the magnetization direction of the ferromagnetic layer 27a-1 is configured to be inverted.

The ferromagnetic layer 27a-1 is generally a ferromagnetic layer using an element selected from cobalt (Co), iron (Fe), and nickel (Ni). A cobalt-iron (CoFe) alloy, iron (Fe), cobalt-iron-boron (CoFeB), iron boron (FeB), cobalt boron (CoB), and cobalt iron nickel boron (CoFeNiB), etc. are typical ferromagnetic layers in which magnetization is vertical. These have a body-centered cubic (bcc) structure. Phosphorous (P) and carbon (C), etc., can be listed as elements that substitute for boron (B). The magnetic material, such as the above-described CoFeB, etc., causes vertical magnetic anisotropy on the interface when magnetic material is brought into contact with an oxide having a NaCl(001) structure. A typical example is MgO(001)/CoFeB stacked film. The ferromagnetic layer 27a-1 further contains a noble metal. The ferromagnetic layer 27a-1 contains, as a noble metal, at least one element selected from the group consisting of, for example, ruthenium (Ru), rhodium (Rh), palladium (Pd), silver (Ag), osmium (Os), iridium (Ir), platinum (Pt), and gold (Au). Among these elements, osmium (Os), iridium (Ir), platinum (Pt), and gold (Au), which are 5d noble metal elements, are preferable. From the viewpoint of improving the VCMA effect (which is described later), iridium (Ir) is the most preferable. It is preferable that the ferromagnetic layer 27a-1 contain the above-listed noble metals equal to or less than 50 at %. The unit "at %" represents the atomic percent. If multiple types of the above-listed noble metals are contained in the ferromagnetic layer 27a-1, a total of the contained noble metals should be equal to or less than 50 at %. This is because if the ferromagnetic layer 27a-1 contains more than 50 at % of the above-listed noble metals, the magnetic properties of the ferromagnetic layer 27a-1 may be degraded. In other words, if the ferromagnetic layer 27a-1 contains more than 50 at % of the above-listed noble metals, the saturation magnetization Ms and the magnetic anisotropy energy Ku of the ferromagnetic layer 27a-1 may be significantly lowered. A preferable concentration gradient is one in which a concentration on the side closer to the dielectric layer 27a-2 is high. The concentration gradient can be detected by nano EDX (energy dispersive X-ray spectroscopy) analysis and nano EELS (electron energy loss spectroscopy).

As the ferromagnetic layer 27a-1, at least one alloy film selected from the group consisting of, for example, cobalt platinum (CoPt), cobalt nickel (CoNi), and cobalt palladium (CoPd), or a stacked film such as a Co/Pt stacked film, a Co/Pd stacked film, and a Co/Ni stacked film, etc. may be used. Even in cases where these stacked films are used, from the viewpoint of efficiently improving the VCMA effect (which is described later), it is preferable that more than half of the magnetic anisotropy of the ferromagnetic layer 27a-1 be interface magnetic anisotropy that is caused in the interface between the ferromagnetic layer 27a-1 and the dielectric layer 27a-2.

The ferromagnetic layer 27a-1 is formed by inserting a noble metal layer between multiple layers that constitute the ferromagnetic layer 27a-1. The ferromagnetic layer 27a-1 may be formed by adding a noble metal to at least one of the layers that constitute the ferromagnetic layer 27a-1.

The ferromagnetic layer 27a-1 is a ferromagnetic layer in which the uppermost layer, namely the layer in contact with the dielectric layer 27a-2, contains cobalt (Co), iron (Fe), or nickel (Ni). This is the same in the case where a stacked film such as a Co/Pt stacked film is used.

On the upper surface of the ferromagnetic layer 27a-1, the dielectric layer 27a-2 is provided. The dielectric layer 27a-2 has a film thickness of equal to or less than 2.0 nm, for example. The dielectric layer 27a-2 has a tetragonal structure, a cubic structure, or a NaCl crystal structure in which the film surface is oriented in (001). To maintain the crystal system, stacking of three or more atom layers is necessary; therefore, the film thickness of the dielectric layer 27a-2 is preferably equal to or greater than 0.5 nm. This is because the intensity of the magnetostatic coupling and inter-layer exchange coupling between the ferromagnetic layer 27a-1 and the ferromagnetic layer 27a-3 in a ferromagnetic manner is increased. With the dielectric layer 27a-2 being interposed therebetween, the ferromagnetic layer 27a-1 and the ferromagnetic layer 27a-3 make a magnetostatic coupling in a ferromagnetic manner and an inter-layer exchange coupling in a ferromagnetic manner. Thus, the ferromagnetic layer 27a-1 and the ferromagnetic layer 27a-3 show a magnetization reversal behavior as a whole. The dielectric layer 27a-2 has a dielectric constant equal to or larger than that of the nonmagnetic layer 27b. For example, it is preferable that the dielectric layer 27a-2 have a dielectric constant equal to or larger than that of magnesium oxide (MgO).

Examples of the dielectric layer 27a-2 having a NaCl crystal structure are magnesium oxide (MgO), calcium oxide (CaO), nickel oxide (NiO), cobalt oxide (CoO), iron oxide (FeO), chrome oxide (CrO), strontium oxide (SrO), vanadium oxide (VO), manganese oxide (MnO), barium oxide (BaO), cadmium oxide (CdO), etc. Examples of a cubic or tetragonal dielectric layer 27a-2 are an $A_2O_3$ or an $AO_2$ rutile structure. Examples of element A applied to the above structure film are ytterbium (Yb), yttrium (Y), gallium (Ga), europium (Eu), erbium (Er), holmium (Ho), lutecium (Lu), iron (Fe), zirconium (Zr), neodymium (Nd), scandium (Sc), chrome (Cr), terbium (Tb), tin (Sn), samarium (Sm), cerium (Ce), dysprosium (Dy) thulium (Tm), gadolinium (Gd), bismuth (Bi), hafnium (Hf), lanthanum (La), praseodymium (Pr), titanium (Ti), indium (In), ruthenium (Ru), iridium (Ir), and osmium (Os), etc. An example of a tetragonal dielectric layer 27a-2 is a three-element material, such as $ABO_3$. Examples of the three-element material are, for example, $SrRuO_3$, $SrTiO_3$, and $LaAlO_3$.

The dielectric layer 27a-2 is not limited to being nonmagnetic as long as it has ferroelectricity, and it may further have ferromagnetic properties or ferrimagnetic properties. Examples of a compound contained in a ferromagnetic or ferrimagnetic dielectric layer 27a-2 are $Fe_3O_4$, $CoFe_2O_4$, $MnFe_2O_4$, $NiFe_2O_4$, $CuFe_2O_4$, and $MgFe_2O_4$. The above-described compound has a spinel structure. In this case, the ferromagnetic layer 27a-1 and the ferromagnetic layer 27a-3 have a magnetic inter-layer interaction and the magnetization coupling force is thus improved. This is preferable from the viewpoint of integration and uniformity of magnetization reversal in the ferromagnetic layer 27a-1 and the ferromagnetic layer 27a-3.

The ferromagnetic layer 27a-1 has a function of causing the VCMA (voltage control of magnetic anisotropy) effect in the interface with the above-described dielectric layer 27a-2. The VCMA effect is a phenomenon of changing an energy barrier ΔE required for reversing magnetization of a magnetic material through an application of a voltage. The VCMA effect physically changes an energy barrier ΔE; however, when the VCMA effect is measured, the change in the coercivity Hc of the ferromagnetic layer 27a-1 is measured as a measurement parameter. A lowered coercivity Hc means a lowered energy barrier ΔE. The noble metal contained in the ferromagnetic layer 27a-1 may increase the VCMA effect.

From the viewpoint of increasing the VCMA effect, it is preferable that the noble metal contained in the ferromagnetic layer 27a-1 contain at least one element selected from the group consisting of osmium (Os), iridium (Ir), platinum (Pt), and gold (Au), which are 5d noble metal elements. Since the VCMA effect is increased by the dielectric polarization, the dielectric constant of the dielectric layer 27a-2 is preferably higher than, for example, that of magnesium oxide (MgO). From the viewpoint of increasing the VCMA effect and obtaining magnetic anisotropy at the same time, it is preferable that an average concentration of a noble metal contained in the ferromagnetic layer 27a-1 be 50 at % or lower. This is because if the ferromagnetic layer 27a-1 contains the above-listed noble metals at more than 50 at %, the magnetic properties of the ferromagnetic layer 27a-1 may be degraded. In other words, if the above-listed noble metals are contained at more than 50 at % in the ferromagnetic layer 27a-1, the saturation magnetization Ms and the magnetic anisotropy energy Ku of the ferromagnetic layer 27a-1 may be significantly lowered. Since the ferromagnetic layer 27a-1 has interface magnetic anisotropy in the interface with the dielectric layer 27a-2, a local coverage factor of a noble metal in the interface between the ferromagnetic layer 27a-1 and the dielectric layer 27a-2 may be 100%. In the interface between the ferromagnetic layer 27a-1 and the dielectric layer 27a-2, a magnetoresistance effect does not need to manifest; therefore, the interface coverage factor that can maximize the degree of efficiency of the VCMA effect is selected. However, even if the coverage factor is 100%, it is expected that a detected concentration would fall between the order of 50% and 90% because of the influence from the upper and lower layers due to a spot size of an electron beam when a possible analysis method (EDX or EELS) is used.

On the upper surface of the dielectric layer 27a-2, a ferromagnetic layer 27a-3 is provided. Ferromagnetic layer 27a-3 has a film thickness equal to or greater than 0.5 nm and equal to or less than 3.0 nm, for example. The ferromagnetic layer 27a-3 is a conductive film having a ferromagnetic magnetostatic coupling or a ferromagnetic interlayer exchange coupling in conjunction with the ferromagnetic layer 27a-1. The ferromagnetic layer 27a-3 has an axis of easy magnetization in a direction perpendicular to the film plane (Z direction). For this reason, the magnetization direction of the ferromagnetic layer 27a-3 becomes parallel to the magnetization direction of the ferromagnetic layer 27a-1 in a static state. In the descriptions hereinafter, the magnetization direction of the ferromagnetic layers 27a-1 and 27a-3 may be referred to as the magnetization direction of the layer stack 27a.

The ferromagnetic layer 27a-3 contains iron (Fe). The ferromagnetic layer 27a-3 may further include at least one of cobalt (Co) or nickel (Ni). The ferromagnetic layer 27a-3 may further include boron (B). Specifically, the ferromagnetic layer 27a-3 includes, for example, cobalt-iron-boron (CoFeB), iron boron (FeB), cobalt boron (CoB), and cobalt iron nickel boron (CoFeNiB).

An amount of a noble metal in the ferromagnetic layer 27a-3 is smaller than that in the ferromagnetic layer 27a-1. If possible, it is preferable that the concentration of the noble metal contained in the ferromagnetic layer 27a-3 be low enough to be negligible. In other words, the concentration of a noble metal contained in the ferromagnetic layer 27a-3 is significantly lower than that in the ferromagnetic layer 27a-1. It is preferable that the concentration be lower than the detectable limit in physical analysis such as TEM-EDX or EELS, etc. This is important to suppress degradation of a tunneling magnetoresistance (TMR) ratio. The dielectric layer 27a-2 functions as a diffusion barrier and prevents a noble metal contained in the ferromagnetic layer 27a-1 from diffusing to the ferromagnetic layer 27a-3.

The layer stack 27a that includes the ferromagnetic layer 27a-1, the dielectric layer 27a-2, and the ferromagnetic layer 27a-3 configured in the above-described manner is used as a storage layer.

On the upper surface of the ferromagnetic layer 27a-3, a nonmagnetic layer 27b is provided. The nonmagnetic layer 27b is an insulating film having nonmagnetic properties. The nonmagnetic layer 27b is used as a tunnel barrier layer. The nonmagnetic layer 27b is provided between the ferromagnetic layer 27a-3 and the ferromagnetic layer 27c, and forms a magnetic tunnel junction in conjunction with these ferromagnetic layers. In other words, a magnetoresistance effect manifests in a magnetic tunnel junction part. Furthermore, if an initial amorphous layer such as cobalt-iron-boron (CoFeB) is used as the interface layer of the ferromagnetic layer 27a-3 and the ferromagnetic layer 27c, the nonmagnetic layer 27b functions as a seed material that provides a nucleus that grows a crystal film from the interface with the ferromagnetic layer 27a-3 in the crystallization of the ferromagnetic layer 27a-3. Similarly, when the cobalt-iron-boron (CoFeB) is used as an interface layer of the ferromagnetic layer 27c, the nonmagnetic layer 27b functions as a seed material to the ferromagnetic layer 27c. Herein, an initial amorphous layer is a layer which is in an amorphous state immediately after the film is formed and crystallizes after annealing. The nonmagnetic layer 27b has a tetragonal or cubic structure with its film plane oriented in a (001) plane. An example of an oxide used in the nonmagnetic layer 27b is magnesium oxide (MgO) for example. Magnesium oxide (MgO) has a NaCl structure. If magnesium oxide (MgO) is used as the nonmagnetic layer 27b, the (001) interface of magnesium oxide (MgO) and the (001) interface of cobalt-iron-boron (CoFeB) are aligned and crystals grow through annealing. For this reason, the cobalt-iron-boron (CoFeB) has a (001)-oriented, body-centered cubic structure.

On the upper surface of the nonmagnetic layer 27b, a ferromagnetic layer 27c is provided. The ferromagnetic layer 27c is an electric conductive film having ferromagnetic properties. The ferromagnetic layer 27c is used as a reference layer. The ferromagnetic layer 27c has an axis of easy magnetization in a direction perpendicular to the film plane (Z direction). The magnetization direction of the ferromagnetic layer 27c is fixed. In other words, magnetization of the reference layer does not move in regular device operation. In the example shown in FIG. 5, the magnetization direction of the ferromagnetic layer 27c is in the direction of the layer stack 27a. A "fixed magnetization direction" indicates the magnetization direction being unchanged by a torque large enough to reverse the magnetization direction of the layer stack 27a. Usually, an interface layer is used for the ferromagnetic layer 27c. As an interface layer of the ferromagnetic layer 27c, an initial amorphous layer, such as cobalt-iron-boron (CoFeB), etc., is used. Furthermore, of the cobalt-iron-boron (CoFeB) layer, a secondary ferromagnetic layer is provided in such a manner that it faces a surface opposite to the surface in contact with the magnesium oxide (MgO) layer. The secondary ferromagnetic layer contains at least one alloy film selected from the group consisting of, for example, cobalt platinum (CoPt), cobalt nickel (CoNi), and cobalt palladium (CoPd). The secondary ferromagnetic layer is a stacked film, such as a Co/Pt stacked film or a Co/Pd stacked film. The cobalt-iron-boron (CoFeB) layer that serves as an initial amorphous layer is stacked with a CoPt, CoPd, Co/Pt, or Co/Pd stacked film when used. In this case, in the interface layer of the ferromagnetic layer 27c, for example the above-described CoFeB layer, the (001)-oriented cubic structure is formed closer to the nonmagnetic layer 27b side compared to the other layers.

On the upper surface of the ferromagnetic layer 27c, a nonmagnetic layer 27d is provided. The nonmagnetic layer 27d is an electric conductive film having nonmagnetic properties. The nonmagnetic layer 27d is used as a spacer layer. The nonmagnetic layer 27d is made of an element selected from the group consisting of ruthenium (Ru), osmium (Os), rhodium (Rh), iridium (Ir), and chrome (Cr), or an alloy thereof. The film thickness of the nonmagnetic layer 27d is equal to or less than 2 nm.

On the upper surface of the nonmagnetic layer 27d, a ferromagnetic layer 27e is provided. The ferromagnetic layer 27e is an electric conductive film having ferromagnetic properties. The ferromagnetic layer 27e is used as a shift cancelling layer. The ferromagnetic layer 27e has an axis of easy magnetization in a direction perpendicular to the film plane (Z direction). The ferromagnetic layer 27e contains at least one alloy selected from the group consisting of, for example, cobalt platinum (CoPt), cobalt palladium (CoPd), cobalt palladium platinum (CoPdPt), and cobalt chrome platinum (CoCrPt). The ferromagnetic layer 27e may be a stacked film, such as a Co/Pt stacked film, a Co/Pd stacked film, and a Co/Ni stacked film.

The ferromagnetic layer 27c and the ferromagnetic layer 27e are antiferromagnetically coupled by the nonmagnetic layer 27d. That is, the ferromagnetic layer 27c and the ferromagnetic layer 27e are coupled in such a manner that their magnetization directions are anti-parallel to each other. Such an antiferromagnetic magnetic coupling between the ferromagnetic layer 27c, the nonmagnetic layer 27d, and the ferromagnetic layer 27e is called a SAF (synthetic antiferromagnetic) coupling. With a SAF coupling state, the ferromagnetic layer 27e can cancel the influence of the leakage magnetic field of the ferromagnetic layer 27c on the change in the magnetization direction of the layer stack 27a, thereby reducing the substantial influence of the leakage magnetic field of the ferromagnetic layer 27c on the layer stack 27a.

The magnetoresistance effect element MTJ may take either a low-resistance state or a high-resistance state, depending on whether the relative relationship between the magnetization directions of the storage layer and the reference layer are parallel or anti-parallel. In the present embodiment, the magnetization direction of a storage layer with respect to the magnetization direction of a reference layer is controlled without supplying a write current to such a magnetoresistance effect element MTJ. Specifically, a write method using a spin orbit torque caused by supplying a current to an interconnect SOTL is adopted.

When write current Ic0 of a certain magnitude is allowed to flow through interconnect SOTL in the Y direction, the relative relationship between the magnetization directions of the storage layer SL and the reference layer RL becomes parallel. In this parallel state, resistance of the magnetoresistance effect element MTJ takes the minimum value, and the magnetoresistance effect element MTJ is set to a low-resistance state. This low-resistance state is called a "P (parallel) state", and is defined as a state of data "0".

If a write current Ic1 is supplied to the interconnect SOTL in the direction opposite to that of the write current Ic0, the relative relationship of the magnetization direction between the storage layer and the reference layer becomes anti-parallel. In this anti-parallel state, resistance of the magnetoresistance effect element MTJ takes the maximum value, and the magnetoresistance effect element MTJ is set to a high-resistance state. This high-resistance state is called an "AP (anti-parallel) state", and is defined as, for example, the state of data "1".

How data "1" and data "0" are defined is not limited to the above-described example. For example, the P state may be defined as data "1", and the AP state may be defined as data "0".

The shape of the magnetoresistance effect element MTJ viewed in the Z direction is an elliptic shape or a circular shape. From the viewpoint of integrating the memory cells MC at a high intensity rate, a circular shape is preferable as the shape of the magnetoresistance effect element MTJ viewed in the Z direction. From the viewpoint of reducing an area size and electricity consumption, the short-side length of an elliptic magnetoresistance effect element MTJ and the diameter of a circular magnetoresistance effect element MTJ is preferably 100 nm or less. Regarding the layer stack 27a, if a rapid magnetization reversal at the rate equal to or faster than 5 nsec is performed, the short-side length or the diameter will preferably be 30 nm or less. If the diameter of the magnetoresistance effect element MTJ is 10 nm or less, the magnetization reversal will look like single magnetic domain simultaneous magnetization reversal, and will exhibit a magnetization reversal mode in which clear magnetic walls are not formed. Rapid magnetization reversal is thus realized.

1.2 Write Operation

Next, a write operation in the magnetic memory device according to the embodiment is described.

1.2.1 Voltage Application

Figure 7:
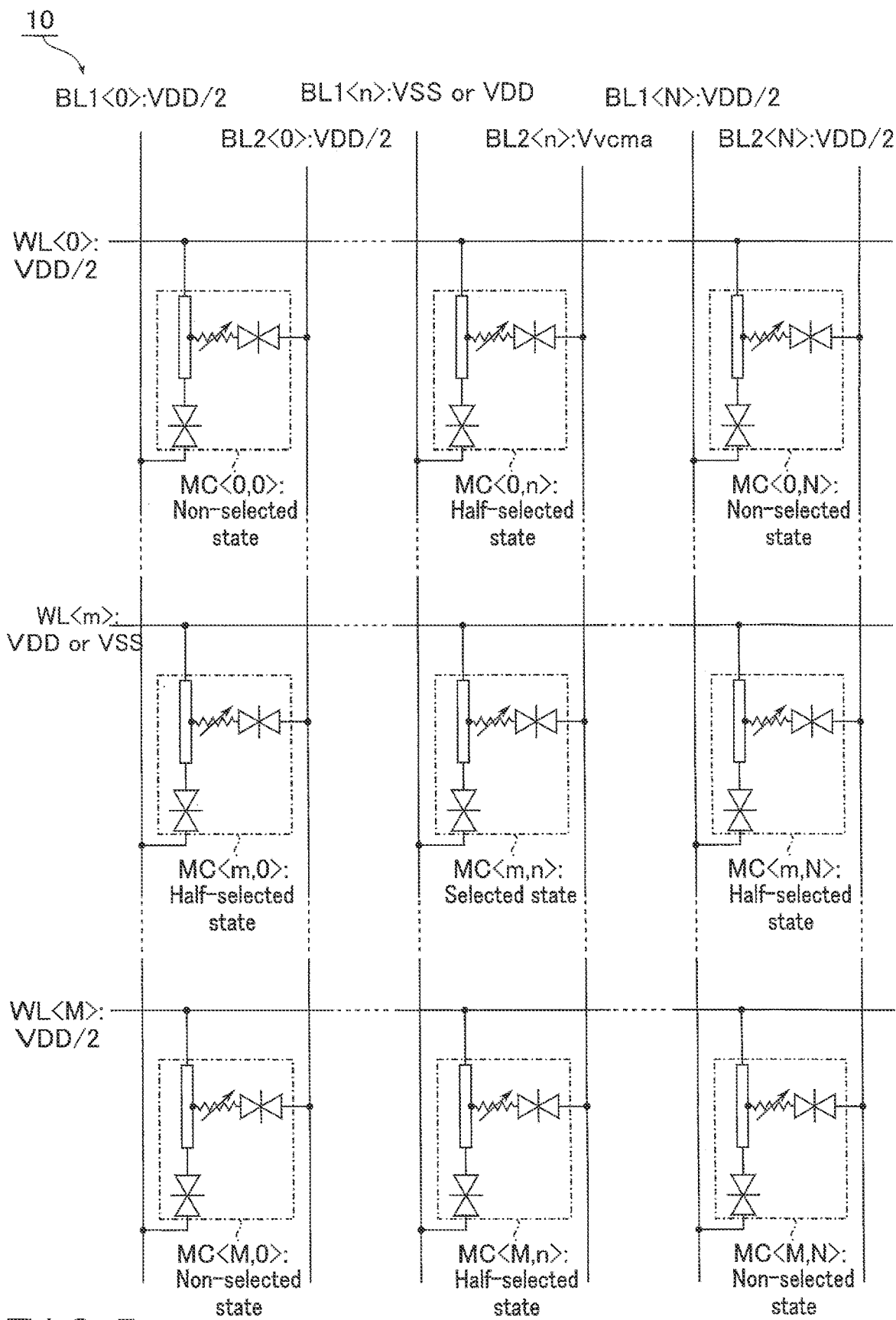
FIG. 7 is a circuit diagram showing an example of a write operation in the magnetic memory device according to the embodiment.

FIG. 7 is a circuit diagram showing an example of a write operation in the magnetic memory device according to the embodiment. FIG. 7 shows an example of voltages applied to various interconnects in the case where data is written in memory cell MC<m, n> of the plurality of memory cells MC (0<m<M, 0<n<N).

When data is written in memory cell MC<m, n>, a voltage VDD or VSS is applied to each of word line WL<m> and first bit line BL1<n>. If voltage VDD is applied to word line WL<m>, voltage VSS is applied to first bit line BL1<n>. If voltage VSS is applied to word line WL<m>, voltage VDD is applied to first bit line BL1<n>. Voltage Vvcma (=VDD/2+a) is applied to the second bit line BL2<n>. Voltage VDD/2 is applied to all word lines WL except for word line WL<m>, all first bit lines BL1 except for first bit line BL1<n>, and all second bit lines BL2 except for second bit line BL2<n>.

A potential difference VDD occurs between word line WL<m> and first bit line BL1<n>. In this case, a potential in a coupling part between interconnect SOTL<m, n> and magnetoresistance effect element MTJ<m, n> is VDD/2. For this reason, a potential difference α occurs between interconnect SOTL<m, n> and second bit line BL2<n>.

A potential difference VDD/2 occurs between word line WL<m> and a discretionarily selected first bit line BL1 excluding first bit line BL1<n>. A potential difference VDD/2 occurs between a discretionarily selected word line WL excluding word line WL<m> and a first bit line BL1<n>. No potential difference occurs between a discretionarily selected word line WL excluding word line WL<m> and a discretionarily selected first bit line BL1 excluding first bit line BL1<n>. The potential difference that occurs between discretionarily selected interconnect SOTL and second bit line BL2, excluding a set of interconnect SOTL<m, n> and second bit line BL2<n>, is smaller than a potential difference α.

Herein, voltage VSS is a reference potential. The voltage VSS is 0 V, for example. Voltage VDD (potential difference VDD) to voltage VSS turn the switching elements SEL1 and SEL2 to an on state. The potential difference VDD/2 turns the switching element SEL1 to an off state. A potential difference α between voltage Vvcma and voltage VDD/2 turns the switching element SEL2 to an on state. The potential difference that occurs between discretionarily selected interconnect SOTL and second bit line BL2, excluding a set of interconnect SOTL<m, n> and second bit line BL2<n>, turns the switching element SEL2 to an off state.

For this reason, the switching elements SEL1<m, n> and SEL2<m, n> are turned to an on state. All switching elements SEL1 except for switching element SEL1<m, n> are turned to an off state. All switching elements SEL2 except for switching element SEL2<m, n> are turned to an off state.

Thus, a potential difference VDD can be applied to interconnect SOTL<m, n> and a potential difference α can be applied to magnetoresistance effect element MTJ<m, n> at the same time. Applying the potential difference VDD to the conductive layer 24 allows a current for changing a resistance state of the magnetoresistance effect element MTJ to flow. Applying the potential difference α to the magnetoresistance effect element MTJ allows a VCMA effect having a significant magnitude to occur in ferromagnetic layer 24a-1. A current also flows in magnetoresistance effect element MTJ<m, n> when the switching element SEL2 is turned to an on state; however, an amount of the current is negligibly minute.

In the above-described write operation, the state of memory cell MC<m, n> may be called a selected state. The states of memory cells MC<0, n> through MC<m−1, n>, MC<m+1, n> through MC<M, n>, MC<m, 0> through MC<m, n−1>, and MC<m, n+1> through MC<m, N> may be called a "half-selected state". The states of all memory cells MC not in a selected state or a half-selected state may be called a "non-selected state".

1.2.2 VCMA Effect

Figure 8:
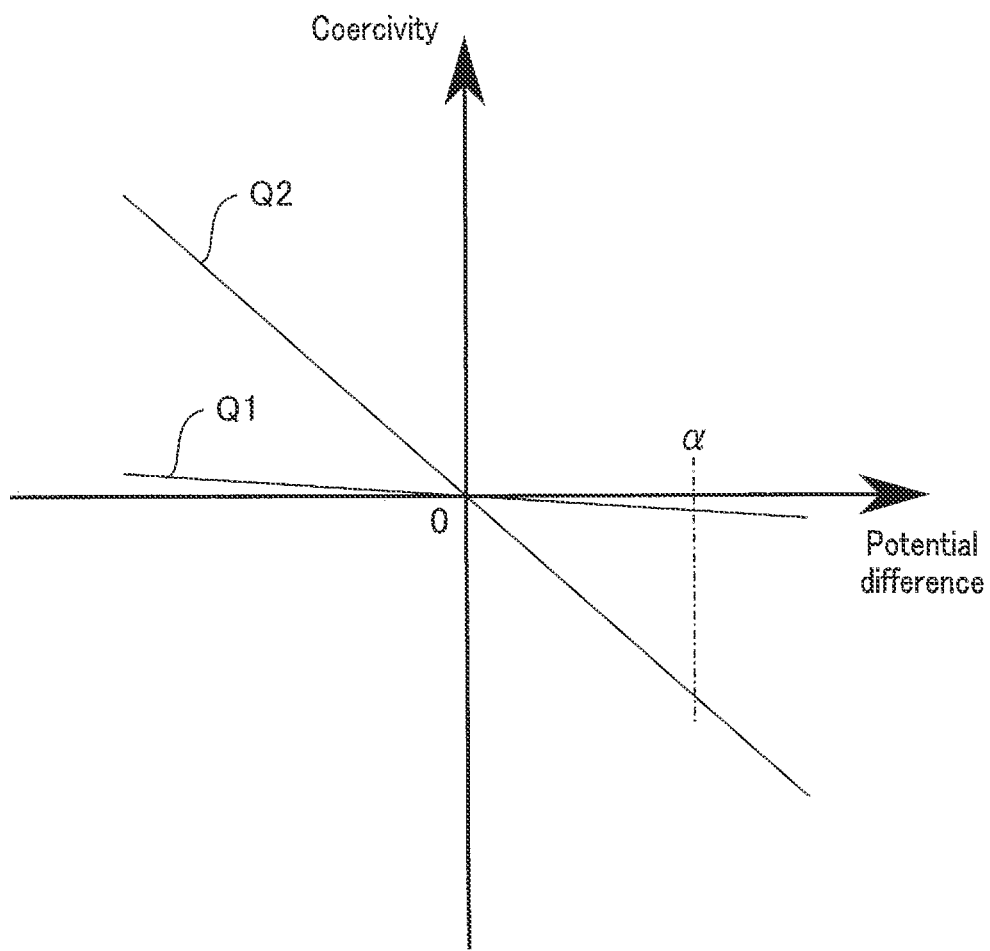
FIG. 8 is a diagram showing an example of a VCMA effect that occurs in a storage layer of a memory cell of the magnetic memory device according to the embodiment.
Figure 9:
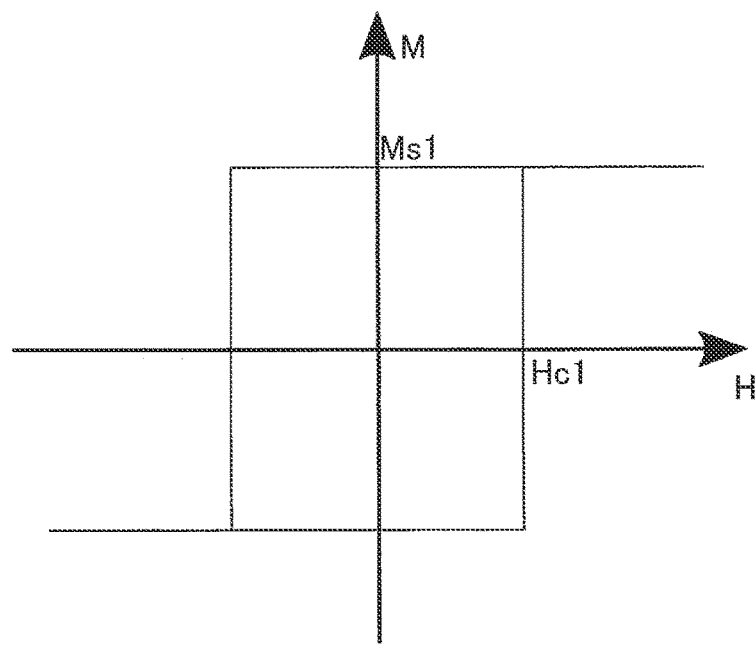
FIG. 9 is a diagram showing an example of a magnetization curve of a storage layer of a memory cell of the magnetic memory device according to the embodiment.
Figure 10:
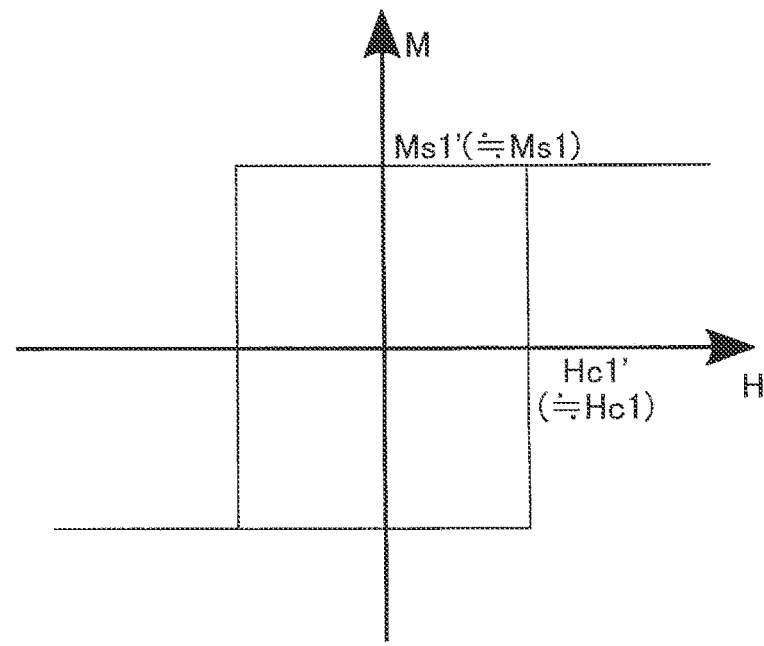
FIG. 10 is a diagram showing an example of a magnetization curve of a storage layer of a memory cell of the magnetic memory device according to the embodiment.
Figure 11:
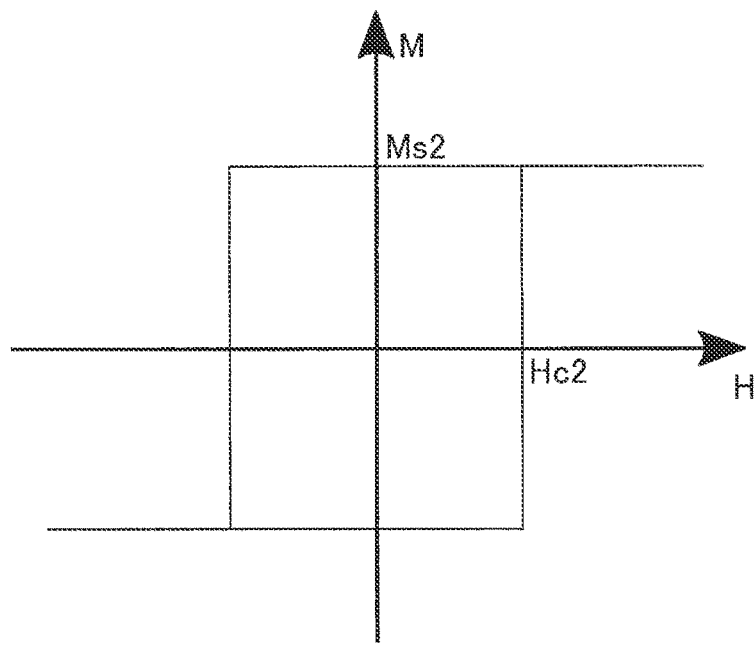
FIG. 11 is a diagram showing an example of a magnetization curve of a storage layer of a memory cell of the magnetic memory device according to the embodiment.
Figure 12:
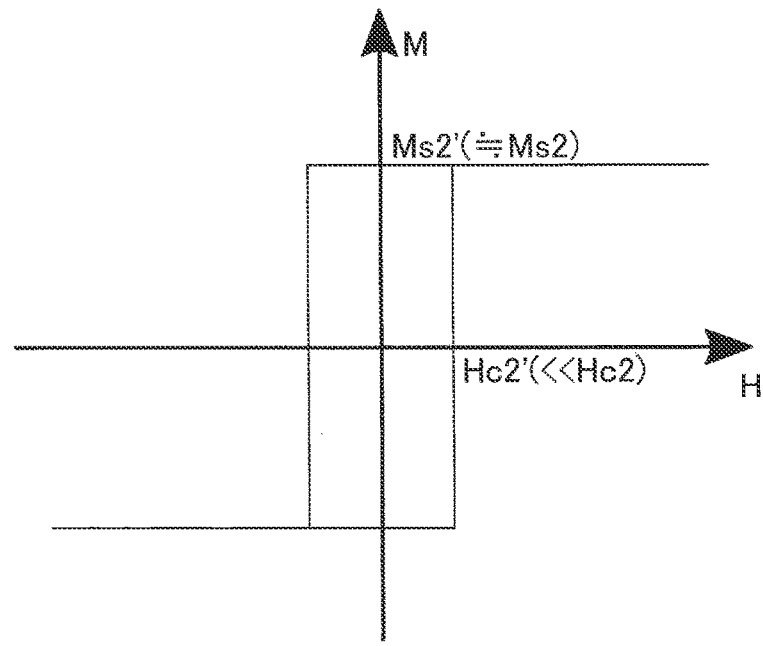
FIG. 12 is a diagram showing an example of a magnetization curve of a storage layer of a memory cell of the magnetic memory device according to the embodiment.

FIG. 8 is a diagram showing an example of a VCMA effect that occurs in a storage layer of a memory cell of the magnetic memory device according to the embodiment. FIGS. 9, 10, 11, and 12 each is a diagram showing an example of a magnetization curve of a storage layer of a memory cell of the magnetic memory device according to the embodiment. In FIG. 8, the change, which is caused by the VCMA effect, in coercivity Hc of ferromagnetic layers 27a-3 and 27a-1 with respect to a potential difference V is shown in lines Q1 and Q2. FIG. 9 shows an example of a magnetization curve of ferromagnetic layer 27a-3 of a memory cell MC in a case where there is no potential difference. FIG. 10 shows an example of a magnetization curve of ferromagnetic layer 27a-3 of a memory cell MC in a case where there is a potential difference. FIG. 11 shows an example of a magnetization curve of ferromagnetic layer 27a-1 of a memory cell MC in a case where there is no potential difference. FIG. 12 shows an example of a magnetization curve of ferromagnetic layer 27a-1 of a memory cell MC in a case where there is a potential difference.

As described above, ferromagnetic layer 27a-3 is configured in such a manner that an amount of a noble metal contained therein is significantly smaller than that in ferromagnetic layer 27a-1. Thus, as shown in line Q1 of FIG. 8, the gradient of the coercivity Hc with respect to the potential difference V in ferromagnetic layer 27a-3 becomes sufficiently small as to be regarded as 0.

As shown in FIGS. 9 and 10, the coercivity Hc of ferromagnetic layer 27a-3 almost does not change between a case where no potential difference occurs such as a standby state (Hc1) and a case where a significant potential difference occurs such as a potential difference α in a write operation (Hc1'). A standby state is a state where neither a write operation nor a read operation is performed. The saturation magnetization Ms of the ferromagnetic layer 27a-3 almost does not change in a static case where a current potential does not occur, such as a standby state (Ms1) and a case where a significantly large current potential, such as a current potential a during a write operation, occurs (Ms1').

On the other hand, ferromagnetic layer 27a-1 is configured to contain a noble metal. Thus, as shown in line Q2, the gradient of the coercivity Hc with respect to the potential difference V in the ferromagnetic layer 27a-1 becomes a large negative value.

Thus, as shown in FIGS. 11 and 12, the coercivity (Hc2') of the ferromagnetic layer 27a-1 in the case where a significantly large potential difference, such as a potential difference α during a write operation, occurs is significantly decreased compared to a static case where no potential difference occurs (Hc2), such as a standby state. In other words, the coercivity of the ferromagnetic layers 27a-1 and 27a-3 as a whole becomes lower in the case where a significantly large potential difference, such as a potential difference α during a write operation, occurs than in a static case, such as a standby state, where no potential difference occurs. The saturation magnetization Ms of the ferromagnetic layer 27a-1 almost does not change between a static case where a current potential does not occur (Ms2) and the case where a significantly large current potential, such as a current potential a during a write operation, occurs (Ms2').

Herein, the energy barrier ΔE of a ferromagnetic layer can be expressed by Expression (1) using the saturation magnetization Ms and the coercivity Hc:

$$\Delta E = K u V = (M s H k / 2) \cdot V \approx (M s H c / 2) \cdot V = M s V H c / 2 \quad (1)$$

In the above Expression (1), Ku represents magnetic anisotropy energy. V represents a volume, and V represents a product of a device area size S and a film thickness t. Hk represents an anisotropic magnetic field.

Thus, if a potential difference does not occur, the energy barrier ΔE in each of the ferromagnetic layer 27a-1 and the ferromagnetic layer 27a-3 almost does not change. For this reason, if a potential difference does not occur, the energy barrier ΔE of the entire storage layer almost does not change. In the case where a significantly large potential difference such as a potential difference α occurs, the energy barrier ΔE of the ferromagnetic layer 27a-3 does not change, whereas the energy barrier ΔE of the ferromagnetic layer 27a-1 is significantly reduced. In other words, a setting where an amount of reduction in the energy barrier ΔE of the ferromagnetic layer 27a-1 is large is preferable. For this reason, if a significantly large potential difference, such as a potential difference α, occurs, the energy barrier ΔE is significantly reduced in the entire storage layer. Thus, only when a significantly large potential difference occurs, the energy barrier ΔE in the entire storage layer is reduced. Accordingly, a selected memory cell MC during a write operation becomes more writable compared to the case where no VCMA effect is utilized.

1.2.3 Magnetization Reversal

Figure 14:
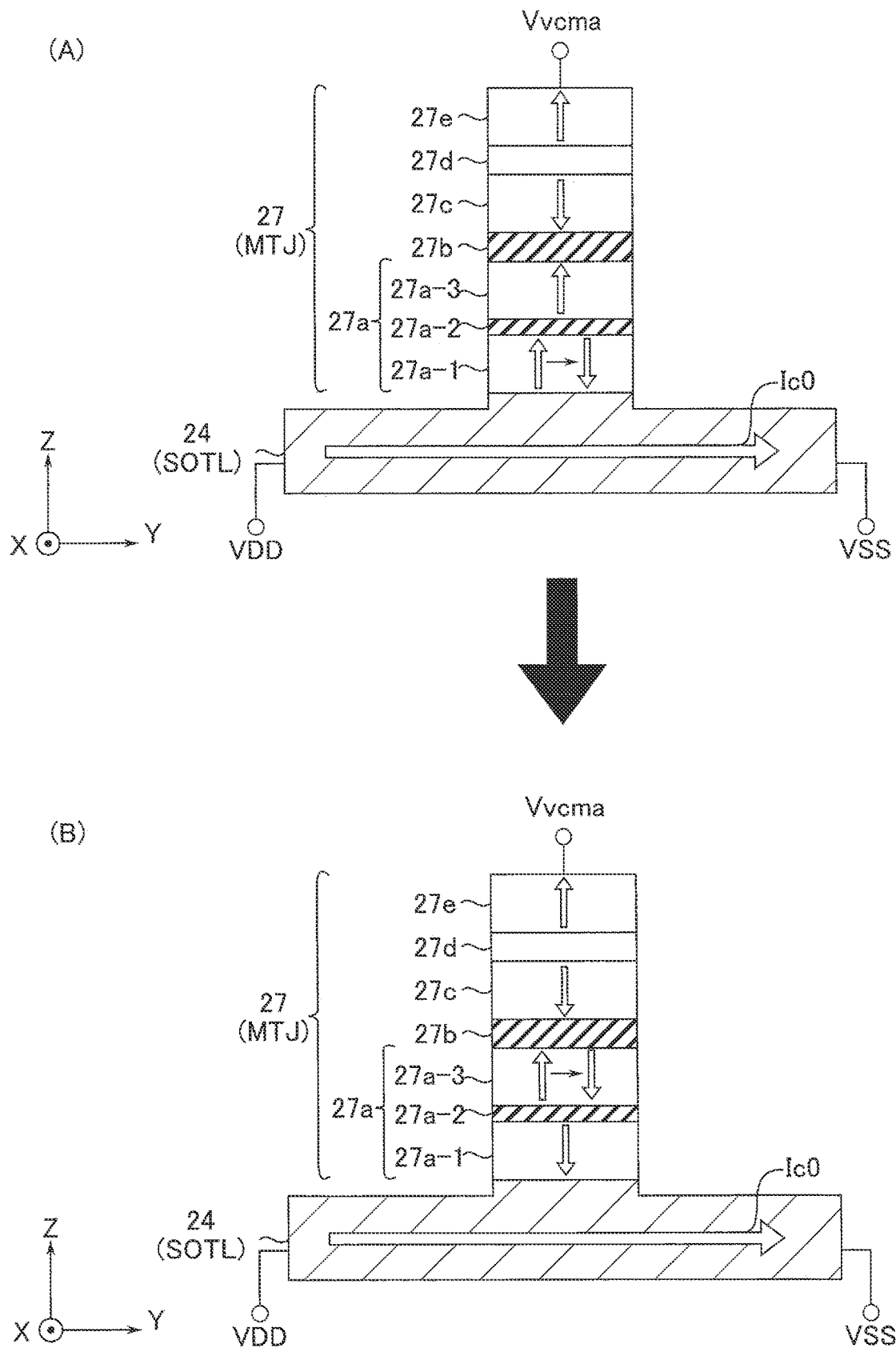
FIG. 14 is a cross-sectional diagram showing an example of a write operation in the magnetic memory device according to the embodiment.

FIGS. 13 and 14 are a cross-sectional view showing an example of a write operation in the magnetic memory device according to the embodiment. FIGS. 13 and 14 schematically show the current flowing in a selected memory cell MC and the magnetization direction of the magnetoresistance effect element MTJ. FIG. 13 corresponds to a write operation when data "1" is written. FIG. 14 corresponds to a write operation when data "0" is written.

First, an operation of writing data "1" is described with reference to FIG. 13. FIG. 13 shows an example where the write current Ic1 flows from a word line WL (the right side of the drawing) to the first bit line BL1 (the left side of the drawing).

As shown in a portion (A) of FIG. 13, a potential difference VDD that turns the switching element SEL1 to an on state occurs between both ends of the conductive layer 24. By controlling the potential difference VDD, a write current Ic1 flows in the conductive layer 24. With the write current Ic1 flowing in the conductive layer 24, a spin orbit torque that acts on and changes the magnetization direction of the ferromagnetic layer 27a-1 to be anti-parallel to the magnetization direction of the ferromagnetic layer 27c is generated. A spin orbit torque acts on the ferromagnetic layer 27a-1 that is in the vicinity of the conductive layer 24. Although not shown in FIG. 13, a bias magnetic field in the Y direction is applied to the ferromagnetic layer 27a-1.

Between both ends of the element layer 27, a potential difference α is generated in such a manner that the potential of the reference layer side is higher than that in the storage layer side. Thus, the VCMA effect is produced and the energy barrier ΔE of the ferromagnetic layer 27a-1 is lowered.

For this reason, the magnetization direction of the ferromagnetic layer 27a-1 is reversed in an anti-parallel direction with respect to the magnetization direction of the ferromagnetic layer 27c by the spin orbit torque, the application of a bias magnetic field, and the assistance of the VCMA effect.

As described above, the ferromagnetic layer 27a-3 constitutes, together with the ferromagnetic layer 27a-1, a magnetostatic coupling or an exchange coupling in a ferromagnetic manner. Thus, as shown in a portion (B) of FIG. 13, the magnetization direction of the ferromagnetic layer 27a-3 is reversed to be parallel with the magnetization direction of the ferromagnetic layer 27a-1.

With the above-described operation, the magnetization direction of the layer stack 27a is reversed to be anti-parallel with the magnetization direction of the ferromagnetic layer 27c, and the operation of writing data "1" is completed.

Next, an operation of writing data "0" is described with reference to FIG. 14. FIG. 14 shows an example where the write current Ic0 flows from a word line WL (the right side of the drawing) to the first bit line BL1 (the left side of the drawing).

As shown in a portion (A) of FIG. 14, a potential difference VDD that turns the switching element SEL1 on occurs between both ends of the conductive layer 24. By controlling the potential difference VDD, a write current Ic0 flows in the conductive layer 24. With the write current Ic0 flowing in the conductive layer 24, a spin orbit torque that acts on and changes the magnetization direction of the ferromagnetic layer 27a-1 to be parallel to the magnetization direction of the ferromagnetic layer 27c is generated. A spin orbit torque acts on the ferromagnetic layer 27a-1 that is in the vicinity of the conductive layer 24. Although not shown in FIG. 14, a bias magnetic field in the Y direction is applied to the ferromagnetic layer 27a-1.

Between both ends of the element layer 27, a potential difference α is generated in such a manner that the potential of the reference layer side is higher than that in the storage layer side. Thus, the VCMA effect is produced and the energy barrier ΔE of the ferromagnetic layer 27a-1 is lowered.

For this reason, the magnetization direction of the ferromagnetic layer 27a-1 is reversed in a parallel direction with respect to the magnetization direction of the ferromagnetic layer 27c by the spin orbit torque, a bias magnetic field, and the assistance of the VCMA effect.

As described above, the ferromagnetic layer 27a-3 constitutes, together with the ferromagnetic layer 27a-1, a magnetostatic coupling or an exchange coupling in a ferromagnetic manner. Thus, as shown in a portion (B) of FIG. 14, the magnetization direction of the ferromagnetic layer 27a-3 is reversed to be parallel with the magnetization direction of the ferromagnetic layer 27a-1.

With the above-described operation, the magnetization direction of the layer stack 27a is reversed to be parallel with the magnetization direction of the ferromagnetic layer 27c, and the operation of writing data "0" is completed.

If the saturation magnetization amount Ms·t of the ferromagnetic layer 27a-1 is larger than that of the ferromagnetic layer 27a-3, the magnetization direction of the ferromagnetic layer 27a-3 is more easily reversible when the magnetization direction of the ferromagnetic layer 27a-1 is reversed. For this reason, it is preferable that a material be selected so that the saturation magnetization amount Ms·t of the ferromagnetic layer 27a-1 becomes larger than that of the ferromagnetic layer 27a-3. In this case, since the ferromagnetic layer 27a-1 and the ferromagnetic layer 27a-3 make a magnetostatic coupling and an inter-layer exchange coupling, it is preferable that the saturation magnetization Ms of the ferromagnetic layer 27a-1 be larger than that of the ferromagnetic layer 27a-3, and the film thickness t of the ferromagnetic layer 27a-1 be larger than that of the ferromagnetic layer 27a-3. If the film thickness t and the saturation magnetization Ms are adjusted, the magnetic anisotropy energy Ku of the ferromagnetic layer 27a-1 may become larger than the magnetic anisotropy energy Ku of the ferromagnetic layer 27a-3. The adjustment of the film thickness t and the saturation magnetization Ms can be performed by adjusting a content of boron (B) if a cobalt-iron-boron (CoFeB) film is used. In this case, the above relationship can be achieved by making the content of boron (B) in the ferromagnetic layer 27a-1 smaller than the content of boron (B) in the ferromagnetic layer 27a-3.

1.3 Effects of Embodiment

In a magnetic memory device 1 according to the embodiment, a data write method using a spin orbit torque is adopted. In this case, there is apprehension that a magnitude of a write current will become larger than that in a data write scheme using a spin transfer torque. According to the embodiment, it is possible to reduce a write current. Hereinafter, the advantageous effect achieved by an embodiment will be described.

According to the embodiment, the layer stack 27a functioning as a storage layer includes a ferromagnetic layer 27a-1 in contact with the conductive layer 24, a ferromagnetic layer 27a-3, and a dielectric layer 27a-2 interposed between the ferromagnetic layer 27a-1 and the ferromagnetic layer 27a-3. Ferromagnetic layer 27a-1 contains a noble metal. Thus, it is possible to significantly lower the energy barrier $\Delta E$ of the ferromagnetic layer 27a-1 in a selected state during a write operation. For this reason, a spin orbit torque that acts on the ferromagnetic layer 27a-1 can be reduced in a write operation. A write current can be thus reduced.

In a state in which a write operation is not performed, such as a standby state, or in a non-selected or half-selected state during a write operation, the energy barrier $\Delta E$ of the ferromagnetic layer 27a-1 is maintained. For this reason, in a standby state etc., it is possible to maintain a state in which the magnetization direction of the ferromagnetic layer 27a-1 is more difficult to reverse than in the selected state during a write operation.

In other words, the concentration of a noble metal contained in the ferromagnetic layer 27a-1 is higher than that in the ferromagnetic layer 27a-3. It is thus possible to suppress degradation of a tunnel magnetic resistance (TMR) ratio, which would be caused if the ferromagnetic layer 27a-3 contains a noble metal. Thus, a tunnel magnetic resistance (TMR) ratio can be maintained and a write current can be reduced at the same time.

The concentration of a noble metal contained in the ferromagnetic layer 27a-1 is 50 at % or lower. The coverage factor of a noble metal contained in the ferromagnetic layer 27a-1 in the interface between the ferromagnetic layer 27a-1 and the dielectric layer 27a-2 is 70% or smaller. It is thereby possible to produce the VCMA effect without damaging the interface magnetic anisotropy of the ferromagnetic layer 27a-1.

The ferromagnetic layers 27a-1 and 27a-3 are designed to have a film thickness of 0.5 nm or less. It is thereby possible to deposit the ferromagnetic layers 27a-1 and 27a-3 without losing the saturation magnetization Ms and the magnetic anisotropy energy Ku. The ferromagnetic layers 27a-1 and 27a-3 are designed to have a film thickness of 3.0 nm or less. It is thereby possible to deposit the ferromagnetic layers 27a-1 and 27a-3 without losing the anisotropic magnetic field Hk, which is a perpendicular magnetic property.

2. Modifications

The foregoing embodiment is not limited to the above-described examples, and various modifications are applicable.

Figure 15:
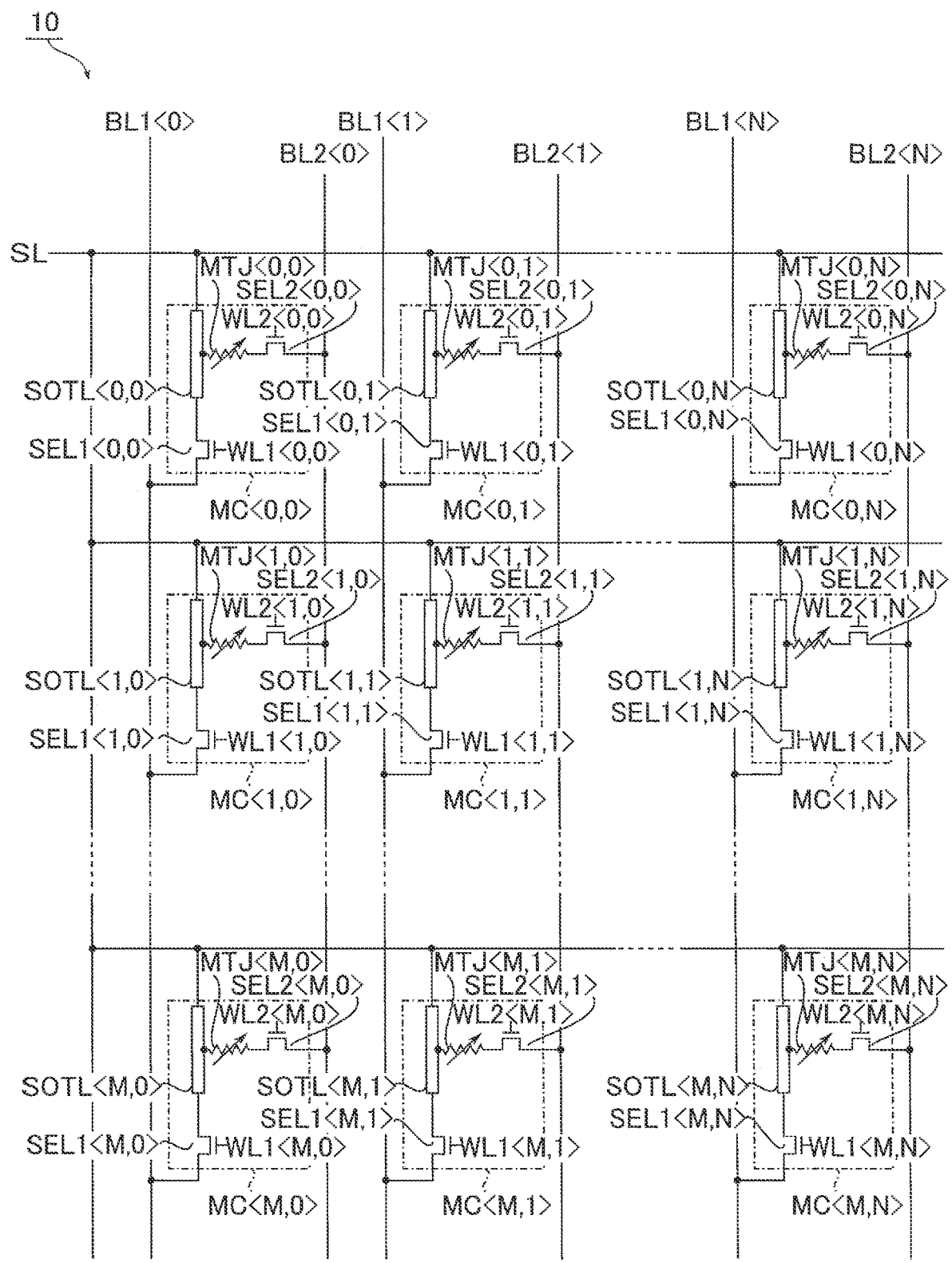
FIG. 15 is a circuit diagram showing a circuit configuration example of a memory cell array according to a first modification.

In the foregoing embodiment, the example is given in which a two-terminal type switching element is adopted as the switching elements SEL1 and SEL2; however, the present embodiment is not limited to this example. For example, as shown in FIG. 15, a three-terminal type switching element may be adopted for the switching elements SEL1 and SEL2. Specifically, a transistor such as a surrounding gate transistor, etc. may be adopted as a three-terminal type switching device. In this case, the first portions of all interconnects SOTL are coupled in common to the source line SL. The source line SL is grounded, for example. The gate of switching element SEL1<i, j> is coupled to word line WL1<i, j>. The gate of switching element SEL2<i, j> is coupled to word line WL2<i, j>. Thus, one memory cell MC can be selected by controlling the switching elements SEL1 and SEL2 by the word line WL1 and WL2 respectively.

Figure 16:
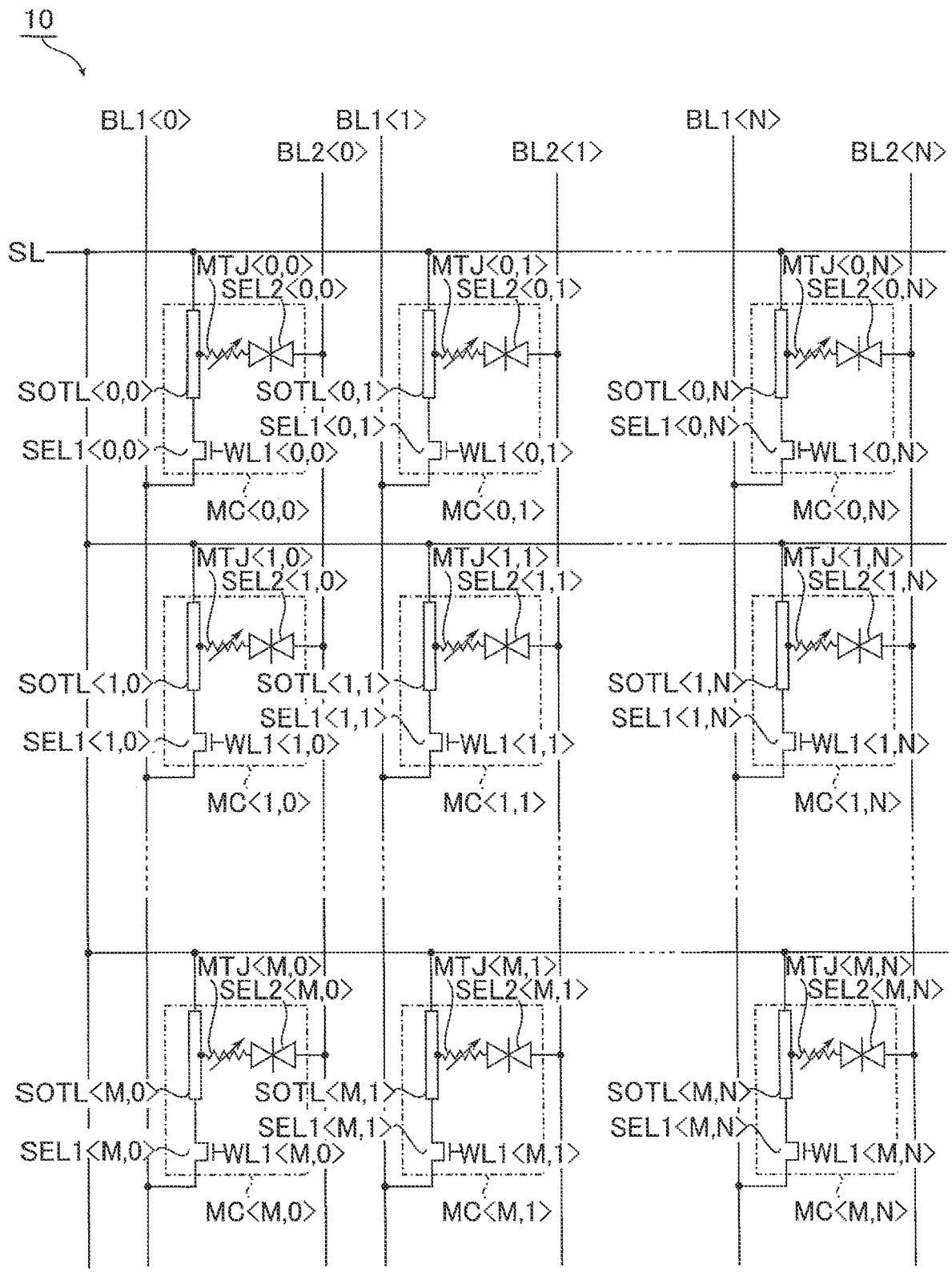
FIG. 16 is a circuit diagram showing a circuit configuration example of a memory cell array according to a second modification.

In the example of FIG. 15, the example is given in which a three-terminal type switching element is adopted as the switching elements SEL1 and SEL2; however, the present embodiment is not limited to this example. For example, as shown in FIG. 16, a three-terminal type switching element may be applied to the switching element SEL1, and a two-terminal type switching element may be applied to the switching element SEL2.

In the foregoing embodiment, the example is given in which a selector is adopted as a two-terminal type switching element applied to the switching element SEL2; however, the present embodiment is not limited to this example. For example, as shown in FIG. 17, a selector may be applied to the switching element SEL1, and a diode may be applied to the switching element SEL2.

In the example of FIG. 17, a selector is adopted for the switching element SEL1; however, the embodiment is not limited to this example. For example, as shown in FIG. 18, a three-terminal switching element may be applied to the switching element SEL1, and a diode may be applied to the switching element SEL2. In this case, similarly to the examples of FIGS. 15 and 16, the first portions of all interconnects SOTL are coupled in common to the source line SL. The source line SL is grounded, for example. The gate of switching element SEL1<i, j> is coupled to word line WL1<i, j>. Thus, one memory cell MC can be selected by controlling the switching element SEL1 by the word line WL1 respectively.

In the foregoing embodiment, a magnetoresistance effect element MTJ is configured in such a manner that a storage layer is located below a reference layer; however, the embodiment is not limited to this example. For example, as shown in FIGS. 19 and 20, a magnetoresistance effect element MTJ may be configured in such a manner that a storage layer is located above a reference layer. In this case, in the lower surface of the conductive layer 24, the part coupled to the ferromagnetic layer 27a-1 protrudes lower than the other part of the lower surface of the conductive layer 24. In the example shown in FIG. 19, the side surface of the coupling at which the conductive layer 24 is coupled to the ferromagnetic layer 27a-1 is aligned with the side surface of the ferromagnetic layer 27a-1. In the example shown in FIG. 20, the coupling at which the conductive layer 24 is coupled to the ferromagnetic layer 27a-1 is in a tapered shape.

In the above-described embodiment, the example where the magnetoresistance effect element MTJ has an axis of easy magnetization in a direction vertical to a film surface is explained. For example, the magnetoresistance effect element MTJ may have an axis of easy magnetization in a direction parallel to the film surface. Specifically, the magnetoresistance effect element MTJ may have an axis of easy magnetization along the Y axis, for example. In this case, in a write operation, a bias magnetic field is applied to the ferromagnetic layer 27a-1 in the Z direction, together with a spin orbit torque. For example, the magnetoresistance effect element MTJ may have an axis of easy magnetization along the X axis. In this case, in a write operation, it is unnecessary to apply a bias magnetic field to the ferromagnetic layer 27a-1 together with a spin orbit torque.

In the foregoing embodiment, the example where two layered structures L1 and L2 are stacked above the semiconductor substrate 20 is described; however, the embodiment is not limited to the example. For example, three or more layered structures having a same structure may be stacked above the semiconductor substrate 20. For example, a single layered structure may be stacked above the semiconductor substrate 20.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A magnetic memory device comprising:
   a first conductive layer;
   a second conductive layer;
   a third conductive layer extending in a first direction; and
   a 3-terminal type memory cell coupled to the first conductive layer, the second conductive layer, and the third conductive layer, wherein
   the memory cell includes:
      a fourth conductive layer extending in the first direction; and
      a magnetoresistance effect element provided between the fourth conductive layer and the third conductive layer,
   the magnetoresistance effect element includes:
      a first ferromagnetic layer in contact with the fourth conductive layer in a second direction intersecting with the first direction;
      a second ferromagnetic layer provided in an opposite side of the fourth conductive layer with respect to the first ferromagnetic layer;
      a dielectric layer between the first ferromagnetic layer and the second ferromagnetic layer;
      a third ferromagnetic layer provided in an opposite side of the first ferromagnetic layer with respect to the second ferromagnetic layer; and
      a nonmagnetic layer provided between the second ferromagnetic layer and the third ferromagnetic layer and containing oxygen (O) and magnesium (Mg), and
   a concentration of a noble metal contained in the first ferromagnetic layer is higher than a concentration of the noble metal contained in the second ferromagnetic layer.

2. The magnetic memory device according to claim 1, wherein
   the first ferromagnetic layer includes, as the noble metal, at least one element selected from a group consisting of osmium (Os), iridium (Ir), platinum (Pt), and gold (Au).

3. The magnetic memory device according to claim 1, wherein
   the first ferromagnetic layer contains, as the noble metal, at least one element selected from a group consisting of ruthenium (Ru), rhodium (Rh), palladium (Pd), and silver (Ag).

4. The magnetic memory device according to claim 1, wherein
   the concentration of the noble metal contained in the first ferromagnetic layer is 50 at % or lower in total.

5. The magnetic memory device according to claim 1, wherein
   the first ferromagnetic layer is in contact with the dielectric layer.

6. The magnetic memory device according to claim 1, wherein
   a film thickness of the first ferromagnetic layer is equal to or greater than 0.5 nm and equal to or less than 3.0 nm.

7. The magnetic memory device according to claim 1, wherein
   a film thickness of the second ferromagnetic layer is equal to or greater than 0.5 nm and equal to or less than 3.0 nm.

8. The magnetic memory device according to claim 1, wherein
   a saturation magnetization of the first ferromagnetic layer is greater than a saturation magnetization of the second ferromagnetic layer.

9. The magnetic memory device according to claim 1, wherein
   a film thickness of the dielectric layer is equal to or less than 2.0 nm.

10. The magnetic memory device according to claim 1, wherein
    the fourth conductive layer includes at least one element selected from a group consisting of tantalum (Ta), tungsten (W), ruthenium (Ru), rhodium (Rh), palladium (Pd), silver (Ag), copper (Cu), osmium (Os) iridium (Ir), platinum (Pt), gold (Au), manganese (Mn), lead (Pb), and bismuth (Bi).

11. The magnetic memory device according to claim 1, wherein
    a part of the fourth conductive later projects in the second direction.

12. The magnetic memory device according to claim 1, wherein
    a dielectric constant of the dielectric layer is equal to or larger than a dielectric constant of the nonmagnetic layer.

13. The magnetic memory device according to claim 12, wherein
    the dielectric layer has nonmagnetic property.

14. The magnetic memory device according to claim 12, wherein
    the dielectric layer has ferromagnetic or ferrimagnetic property.

15. The magnetic memory device according to claim 14, wherein
    the dielectric layer contains at least one compound selected from a group consisting of $Fe_3O_4$, $CoFe_2O_4$, $MnFe_2O_4$, $NiFe_2O_4$, $CuFe_2O_4$, and $MgFe_2O_4$.

16. The magnetic memory device according to claim 1, wherein
    the fourth conductive layer includes a first portion, a second portion, and a third portion interposed between the first portion and the second portion, the third portion is in contact with the magnetoresistance effect element, the magnetic memory device further includes a control circuit configured to, in a write operation, apply a first voltage to the first portion of the fourth conductive layer, apply a second voltage to the second portion of the fourth conductive layer, and apply a third voltage to the third conductive layer, and the third voltage is higher than half of a difference between the first voltage and the second voltage.

17. The magnetic memory device according to claim 16, wherein a coercivity of an entirety of the first ferromagnetic layer and the second ferromagnetic layer during performance of the write operation is lower than a coercivity of an entirety of the first ferromagnetic layer and the second ferromagnetic layer in a standby state.

18. The magnetic memory device according to claim 16, further comprising:

a first switching element coupled to the magnetoresistance effect element and the third conductive layer; and a second switching element coupled to the first portion or the second portion of the fourth conductive layer.

19. A magnetic memory device comprising:

a first conductive layer;

a second conductive layer;

a third conductive layer;

a 3-terminal type memory cell coupled to the first conductive layer, the second conductive layer, and the third conductive layer; and a control circuit, wherein the memory cell includes:

a fourth conductive layer having a first portion coupled to the first conductive layer, a second portion coupled to the second conductive layer, and a third portion coupled to the third conductive layer and interposed between the first portion and the second portion; and a magnetoresistance effect element coupled between the third conductive layer and the fourth conductive layer, the magnetoresistance effect element includes:

a first ferromagnetic layer containing a noble metal and being in contact with the fourth conductive layer;

a second ferromagnetic layer provided in an opposite side of the fourth conductive layer with respect to the first ferromagnetic layer; and a dielectric layer between the first ferromagnetic layer and the second ferromagnetic layer, and the control circuit is configured to, in a write operation, apply a first voltage to the first conductive layer, apply a second voltage to the second conductive layer, and apply a third voltage to the third conductive layer, and the third voltage is higher than a half of a difference between the first voltage and the second voltage.

20. The magnetic memory device according to claim 19, wherein the second ferromagnetic layer includes a noble metal, and a concentration of the noble metal contained in the first ferromagnetic layer is higher than a concentration of the noble metal contained in the second ferromagnetic layer.

* * * * *